United States Patent
Chang et al.

(10) Patent No.: US 12,294,363 B2
(45) Date of Patent: May 6, 2025

(54) CIRCUIT FOR MITIGATING SINGLE-EVENT-TRANSIENTS

(71) Applicant: ZERO-ERROR SYSTEMS PTE. LTD, Singapore (SG)

(72) Inventors: Joseph Sylvester Chang, Singapore (SG); Wei Shu, Singapore (SG); Yong Qu, Singapore (SG); Kwen Siong Chong, Singapore (SG); Arunjai Mittal, Singapore (SG)

(73) Assignee: ZERO-ERROR SYSTEMS PTE. LTD, Singapore (SG)

( * ) Notice: Subject to any disclaimer, the term of this patent is extended or adjusted under 35 U.S.C. 154(b) by 269 days.

(21) Appl. No.: 17/767,016

(22) PCT Filed: Oct. 7, 2020

(86) PCT No.: PCT/SG2020/050568
§ 371 (c)(1),
(2) Date: Apr. 6, 2022

(87) PCT Pub. No.: WO2021/071426
PCT Pub. Date: Apr. 15, 2021

(65) Prior Publication Data
US 2022/0368327 A1   Nov. 17, 2022

(30) Foreign Application Priority Data

Oct. 8, 2019   (SG) ............................ 10201909392R

(51) Int. Cl.
*G11C 7/10*   (2006.01)
*H03K 3/037*   (2006.01)
(Continued)

(52) U.S. Cl.
CPC ..... *H03K 19/00338* (2013.01); *G11C 7/1069* (2013.01); *G11C 7/1096* (2013.01); *H03K 3/0375* (2013.01); *H03K 17/6872* (2013.01)

(58) Field of Classification Search
CPC ............... G11C 7/1096; G11C 7/1069; H03K 17/6872; H03K 3/0375; H03K 19/00338
(Continued)

(56) References Cited

U.S. PATENT DOCUMENTS 4,833,347 A * 5/1989 Rabe .................. H03K 19/0948
326/23
5,130,581 A * 7/1992 Oh ...................... G11C 11/4091
327/55

(Continued)

FOREIGN PATENT DOCUMENTS

EP          0335008 B1   6/1992
WO     2001010026 A1   2/2001
(Continued)

OTHER PUBLICATIONS

Foreign Communication from a Related Counterpart Application, International Search Report and Written Opinion dated Dec. 23, 2020, International Application No. PCT/SG2020/05068 filed on Oct. 7, 2020.

(Continued)

*Primary Examiner* — Sung Il Cho
(74) *Attorney, Agent, or Firm* — Conley Rose, P.C.

(57) ABSTRACT

A circuit for mitigating single-effect-transients (SETs) comprising: a first sub-circuit comprising a first p-type transistor arrangement configured to generate a first output and a first n-type transistor arrangement configured to generate a second output; and a second sub-circuit comprising a connecting p-type transistor arrangement and a connecting n-type transistor arrangement connected in series, wherein the first (Continued)

output and the second output are electrically coupled to each other through the second sub-circuit.

19 Claims, 12 Drawing Sheets

(51) Int. Cl.
  *H03K 17/687* (2006.01)
  *H03K 19/003* (2006.01)
(58) Field of Classification Search
  USPC .................................................. 365/189.15
  See application file for complete search history.

(56) References Cited

U.S. PATENT DOCUMENTS

| | | | |
|---|---|---|---|
| 5,418,473 | A | 5/1995 | Canaris |
| 6,133,747 | A | 10/2000 | Cameron |
| 6,278,287 | B1* | 8/2001 | Baze ............... H01L 21/761 |
| | | | 365/72 |
| 7,233,518 | B2 | 6/2007 | Liu |
| 7,550,992 | B2 | 6/2009 | Briet et al. |
| 7,719,304 | B1 | 5/2010 | Clark et al. |
| 8,189,367 | B1 | 5/2012 | Lawson et al. |
| 8,988,922 | B1 | 3/2015 | Sang et al. |
| 9,013,219 | B2 | 4/2015 | Cabanas-Holmen et al. |
| 9,912,338 | B1* | 3/2018 | Dodrill ............... H03K 3/0375 |
| 2003/0179031 | A1 | 9/2003 | Arima et al. |
| 2006/0119379 | A1 | 6/2006 | Carlson |
| 2007/0063728 | A1 | 3/2007 | Briet et al. |
| 2007/0242537 | A1 | 10/2007 | Golke et al. |
| 2016/0099027 | A1 | 4/2016 | Chertkow et al. |

FOREIGN PATENT DOCUMENTS

| | | |
|---|---|---|
| WO | 2018231148 A1 | 12/2018 |
| WO | 2019143302 A1 | 7/2019 |
| WO | 2019182512 A1 | 9/2019 |
| WO | 2021071426 A1 | 4/2021 |

OTHER PUBLICATIONS

Foreign Communication from a Related Counterpart Application, Extended European Search Report dated Oct. 11, 2023, European Application No. 20875572.8 filed on Oct. 7, 2020.
Jiang H, et al., "Power-Aware SE Analysis of Different FF Designs at the 14-/16-nm Bulk FinFET CMOS Technology Node", IEEE Transactions on Nuclear Science, IEEE, USA, vol. 65, No. 8, Aug. 1, 2018, ISSN: 0018-9499, DOI: 10.1109/TNS.2018.2831002.
P. E. Dodd, et al., "Current and Future Challenges in Radiation Effects on CMOS Electronics," IEEE Transactions on Nuclear Science, vol. 57, No. 4, pp. 1747-1763, Aug. 2010.
R. C. Lacoe, "Improving Integrated Circuit Performance Through the Application of Hardness-by-Design Methodology," IEEE Transactions on Nuclear Science, vol. 55, No. 4, pp. 1903-1925, Aug. 2008.
R. C. Lacoe, et al., "Application of Hardness-by-Design Methodology to Radiation-Tolerant ASIC Technologies," IEEE Transactions on Nuclear Science, vol. 47, No. 6, pp. 2334-2341, Dec. 2000.
R. M. Diestelhorst, et al., "Junction Isolation Single Event Radiation Hardening of a 200 GHZ SiGe:C HBT Technology Without Deep Trench Isolation," IEEE Transactions. Nuclear Science, vol. 56, No. 6, pp. 3402-3407, Dec. 2009.
T. Calin, et al., "Upset Hardened Memory Design for Submicron CMOS Technology," IEEE Transactions on Nuclear Science, vol. 43, No. 6, pp. 2874-2878, Dec. 1996.
H. H. K. Lee, et al., "Design Framework for Soft-Error-Resilient Sequential Cells," IEEE Transactions on Nuclear Science, vol. 58, No. 6, pp. 3026-3032, Dec. 2011.
B. Narasimham, et al., "A Hysteresis-Based D-Flip-Flop Design in 28 nm CMOS for Improved SER Hardness at Low Performance Overhead," IEEE Transactions on Nuclear Science, vol. 59, No. 6, pp. 2847-2851, Dec. 2012.
Lin, et al., "Experimental investigation into radiation-hardening-by-design (RHBD) flip-flop designs in a 65nm CMOS process," in Proc. IEEE International Symposium on Circuits and Systems (ISCAS), 2016, pp. 966-969.
R. Naseer, et al., "DF-DICE: A Scalable Solution for Soft Error Tolerant Circuit Design," in Proc. IEEE International Symposium on Circuits and Systems (ISCAS), 2006, 4 pages.
S. Campitelli, et al., "F-Dice: A Multiple Node Upset Tolerant Flip-Flop for Highly Radioactive Environments," in Proc. IEEE International Symposium on Defect and Fault Tolerance in VLSI and Nanotechnology Systems (DFTS), 2013, pp. 107-111.
M. Cabanas-Holmen, et al., "Robust SEU Mitigation of 32 nm Dual Redundant Flip-Flops Through Interleaving and Sensitive Node-Pair Spacing," IEEE Transactions on Nuclear Science, vol. 60, No. 6, pp. 4374-4380, Dec. 2013.
Intersil, "Radiation Hardened Octal Transparent Latch, Three-State," HCS573MS datasheet, Sep. 1995, 10 pages.
W. Jang, "Soft-error Tolerant Quasi Delay-insensitive Circuits," PhD Thesis, 2008, 183 pages.
R. Yamamoto, et al., "An Area-Efficient 65nm Radiation-Hard Dual-Modular Flip-Flop to Avoid Multiple Cell Upsets," IEEE Transactions on Nuclear Science, vol. 58, No. 6, pp. 3053-3059, Dec. 2011.
J. Chen, et al., "Radiation Hardened by Design Techniques to Reduce Single Event Transient Pulse Width Based on the Physical Mechanism," Microelectronics Reliability, vol. 52, No. 6, pp. 1227-1232, 2012.
J. S. Chang, et al., "Radiation-Hardened Library Cell Template and its Total Ionizing Dose (TID) Delay Characterization in 65nm CMOS Process," 2014 IEEE 57th International Midwest Symposium on Circuits and Systems (MWSCAS), College Station, TX, 2014, pp. 821-824.
J. Jiang, et al., "Total Ionizing Dose (TID) Effects on Finger Transistors in a 65nm CMOS Process," 2016 IEEE International Symposium on Circuits and Systems (ISCAS), Montreal, QC, 2016, pp. 5-8.
J. Jiang, et al., "A 5.6 ppm/°C Temperature Coefficient, 87-dB PSRR, Sub-1-V Voltage Reference in 65-nm CMOS Exploiting the Zero-Temperature-Coefficient Point," in IEEE Journal of Solid-State Circuits, vol. 52, No. 3, pp. 623-633, Mar. 2017.
K. Wang, et al., "An Ultra Low Power Fault Tolerant SRAM in 90nm CMOS Technology," Thesis, Saskatoon, Saskatchewan, Canada, Jun. 2010, 82 pages.
T. Chen, et al., "Ultra-Low Power Radiation Hardened by Design Memory Circuits," IEEE Transactions on Nuclear Science, vol. 54, No. 6, Dec. 2007.
Foreign Communication from a Related Counterpart Application, International Preliminary Report on Patentability dated Apr. 21, 2022, International Application No. PCT/SG2020/050568 filed on Oct. 7, 2020.

* cited by examiner (Prior-art)

(Prior-art)

(Prior-art)

(Prior-art)

(Prior-art)

CIRCUIT FOR MITIGATING SINGLE-EVENT-TRANSIENTS

CROSS-REFERENCE TO RELATED APPLICATIONS

The present application is a filing under 35 U.S.C. 371 as the National Stage of International Application No. PCT/SG2020/050568, filed Oct. 7, 2020, entitled "CIRCUIT FOR MITIGATING SINGLE-EVENT-TRANSIENTS," which claims priority to Singapore Application No. 10201909392R filed with the Intellectual Property Office of Singapore on Oct. 8, 2019, both of which are incorporated herein by reference in their entirety for all purposes.

FIELD

This invention relates to a circuit for mitigating single-event-transients.

BACKGROUND

In high-reliability (high-rel) applications, including space and autonomous vehicles, the robustness of integrated circuits (ICs) in their electronic systems is one of the most important design considerations. These ICs may be subjected to various possible radiation effects arising from energized heavy-ion particles, alpha particles, protons, etc.

The possible radiation effects include Single-Event-Effects (SEEs) where errors are induced when energized particles strike ICs. One of the SEEs is a Single-Event-Transient (SET) where a single event (e.g., an energized particle) striking at a transistor node induces electrical charges that create a transient pulse on the transistor node. The transient pulse could be detrimental to the functionality of the ICs. For example, in digital circuits, the transient pulse could result in a Single-Event-Upset (SEU) from a flipped logic state in sequential logic, causing an error.

As the occurrence of SEEs in ICs is expected to be high when advanced nano-scaled fabrication processes (e.g. <90 nm feature size) are used and/or under severe irradiation environments, it is highly desirable to mitigate SETs (and hence SEUs) to enhance the overall robustness of ICs for high-rel applications.

In currently available methods to mitigate SETs/SEUs, ICs can be radiation-hardened (rad-hard) by means of dedicated IC fabrication processes, design techniques, or a combination thereof.

Rad-hard by process is rare in the sense that these processes are not readily available and whose costs are typically prohibitive. On the other hand, existing rad-hard design techniques, commonly referred to as Radiation-Hardened-By-Design (RHBD), are more accepted and practised because such design techniques can be incorporated into state-of-the-art commercially-available fabrication processes.

Existing RHBD designs include transistor up-sizing, complex dual-interlocked-cell (DICE) designs, and triple modular redundancy (TMR) designs. However, despite the maturity of RHBD, a major shortcoming of existing RHBD design techniques, including RHBD sequential and memory designs, is their high overheads compared to their non-rad-hard equivalents, where the overheads are qualified in terms of power dissipation, silicon area, and delay. Such high overheads render ICs based on prior-art RHBD designs to limited applications, such as that which can tolerate high overheads.

For example, FIG. 1A (prior art) depicts an existing conventional inverter 100 (NOT gate) having a PMOS transistor 102 and an NMOS transistor 104. The gate terminal of the PMOS transistor 102 and the gate terminal of the NMOS transistor 104 may be controlled by the input A 110. The drain terminal of the PMOS transistor 102 and the drain terminal of the NMOS transistor 104 may be connected together to produce the output Y 112 that should always be an inverse of the input A 110. The source terminal of the PMOS transistor 102 may be connected to the supply voltage $V_{DD}$. The source terminal of the NMOS transistor 104 may be connected to ground $V_{SS}$. The inverter 100 may not be designed to accommodate SEEs, including SETs. The PMOS transistor 102 and NMOS transistor 104 may have a W/L (Width/Length) size of ×2 114 and ×1 116, respectively. The W/L sizes of the PMOS transistor 102 and the NMOS transistor 104 may be low as these sizes may be designed to drive the output Y 112 so that the inverter 100 operates at a desirable speed, or dissipates desirable power or occupies a desirable silicon area.

For mitigating SEEs in existing RHBD means, this inverter 100 may be redesigned to an RHBD inverter 150 as shown in FIG. 1B (prior art), where the sizing of the PMOS transistor 152 and of PMOS transistor 154 may be designed to be 10 times larger, i.e., to ×20 164 for the PMOS transistor 152 and ×10 166 for the NMOS transistor 154 respectively. The up-sized inverter 150 may operate a higher speed but at the cost of higher power overheads and larger area overheads (than the inverter 100). However, the up-sized transistor 150 may be able to likely suppress SETs. A low occurrence of SETs may lead to a low error-rate for digital circuits, including inverters.

The conventional inverter 100 without up-sizing may be vulnerable to SETs. FIG. 2A (prior art) depicts an exemplary scenario where the input A 110 of the inverter 100 is at logic '1' and the corresponding output Y 112 is accordingly at logic '0'. The NMOS transistor 104 is on, ready to allow current $I_N$ 202 to discharge the output Y 112. The current $I_N$ 202 is proportional to the W/L of the NMOS transistor 104. The PMOS transistor 102 is off. When a high energy particle 204 hits at the drain of the PMOS transistor 102, positive charges may be induced. The amount of the positive charges may depend on the linear energy transfer (LET) associated with the particle 204. The higher the LET level, the larger the amount of the positive charges induced. If the amount of the positive charges induced are larger than a threshold value to sufficiently overcome the current $I_N$ 202, a positive SET may result where the output Y 112 becomes at logic '1' instead of '0' when the input A 110 is at logic '1'. This threshold value is termed as the critical charge changed. $Q_{crit\_p}$ 206 is the critical charge changed to generate a positive SET.

Similarly, FIG. 2B (prior art) depicts another exemplary scenario where the input A 110 of the conventional inverter 100 at logic '0' and the corresponding output Y 112 may be at logic '1'. The PMOS transistor 102 is on, ready to allow current $I_P$ 252 to charge the output Y 112. The current $I_P$ 252 is proportional to W/L of the PMOS transistor 102. The NMOS transistor 104 is off. When a high energy particle 254 hits at the drain of the NMOS transistor 104, negative charges may be induced. The amount of the negative charges may depend on the LET associated with the particle 254. The higher the LET level, the larger the amount of the negative charges induced. If the amount of the negative charges induced are larger than a threshold value to sufficiently overcome the current $I_P$ 252, a negative SET may result where the output Y 112 becomes at logic '0' instead of '1' when the input A 110 is at logic '0'. $Q_{crit\_n}$ 256 is the critical charge changed to generate a negative SET.

For silicon, an LET of 1MeV-cm²/mg may introduce about 10.4 fC charges per unit chord length (in um). The chord length is used for estimating the sensitive volume where the electron-hole charges may be induced by an energized particle. The chord length may be typically between 0.5 um to 2 um in a 180 nm CMOS process. The chord length may be different for other process technologies. For some RHBD circuits, an LET threshold of 5 MeV.cm²/mg may be considered, amounting about 52 fC critical charge changed per unit chord length (in um). For some high-end RHBD circuits, an LET threshold of 50 MeV.cm²/mg may be considered, amounting 520 fC critical charge changed per unit chord length (in μm).

Consider the up-sized RHBD inverter 150 in FIG. 1B (prior art) where the PMOS transistor 152 and the NMPS transistor 154 may be sized 10 times bigger and the respective associated current $I_P$ and $I_N$ may be 10 times larger than those of the conventional inverter 100 in FIG. 1A. Put simply, the critical charge changed per unit chord length in the up-sized inverter 150 may need to be larger, in order to be more capable of suppressing SETs induced by high energy particles.

However, the transistor up-sizing technique may be area-/power-inefficient for a complex-gate, particularly when transistors are connected in series. FIG. 3 (prior art) depicts an existing tristate latch 300 where two PMOS transistors 302, 304 are connected in series, and two NMOS transistors 306, 308 are connected in series. The input A 310 controls the PMOS transistor 302 and the NMOS transistor 306. The input B 312 controls the NMOS transistor 308. The input B 312 also controls the up-sized RHBD inverter 150 to generate the signal nB 314 which controls the PMOS transistor 304. The output Y 316 is the output. When the input B 312 is at logic '1', the output Y 316 has the logic state opposite that of the logic state of the input A 310. When the input B 312 is at logic '0', the tristate latch 300 may be at high impedance state where the output Y 316 is floating. For mitigating SETs, all the transistors 302, 304, 306, 308 within the tristate latch 300 need to be upsized. For example, the RHBD inverter 150 may have the same transistor sizing as depicted in FIG. 1B. In FIG. 3, should the output Y316 have the same hardness as the signal nB 314 driven by the up-sized RHBD inverter 150, the PMOS transistors 302, 304 will need to be sized to ×40 each, and the NMOS transistors 306, 308 will need to be sized to ×20 each. Such sizing aim to provide the similar large current drivability (as that in the up-sized RHBD inverter 150) to achieve about the same critical charge changed per unit chord length in order to mitigate SETs. However, such sizing will be costly in terms of power dissipation and silicon area.

In view the high overheads of existing RHBD designs, there is thus a need for a circuit design for mitigating SETs that features lower overheads.

SUMMARY

Disclosed is a circuit for mitigating SETs in digital circuits, including embodiments of the circuit for combinational logic, sequential logic and memory usage, with reduced overheads. While the circuit may mitigate SETs arising from radiation effects, the circuit can be used in other applications, e.g., in autonomous vehicles, which may not suffer from radiation. In short, the circuit is hardened against SETs that may arise from various causes including but not limited to radiation.

According to a first aspect, there is provided a circuit for mitigating single-effect-transients (SETs), the circuit comprising: a first sub-circuit comprising a first p-type transistor arrangement configured to generate a first output and a first n-type transistor arrangement configured to generate a second output; and a second sub-circuit comprising a connecting p-type transistor arrangement and a connecting n-type transistor arrangement connected in series, wherein the first output and the second output may be electrically coupled to each other through the second sub-circuit.

Each p-type transistor arrangement may comprise at least one p-type transistor, and wherein each n-type transistor arrangement may comprise at least one n-type transistor.

A drain terminal of one p-type transistor in the connecting p-type transistor arrangement and a drain terminal of one n-type transistor in the connecting n-type transistor arrangement may be electrically coupled to each other.

The first output may be electrically coupled to a drain terminal of one p-type transistor in the first p-type transistor arrangement and to a source terminal of one p-type transistor in the connecting p-type transistor arrangement, and the second output may be electrically coupled to a drain terminal of one n-type transistor in the first n-type transistor arrangement and to a source terminal of one n-type transistor in the connecting n-type transistor arrangement.

A source terminal of one p-type transistor in the first p-type transistor arrangement may be electrically coupled to $V_{DD}$, and a source terminal of one n-type transistor in the first n-type transistor arrangement may be electrically coupled to $V_{SS}$.

A gate terminal of one n-type transistor in the connecting n-type transistor arrangement may be electrically coupled to $V_{DD}$, and a gate terminal of one p-type transistor in the connecting p-type transistor arrangement may be electrically coupled to $V_{SS}$.

The circuit may further comprise a second p-type transistor arrangement and a second n-type transistor arrangement, the first output may be further electrically coupled to a drain terminal of one p-type transistor in the second p-type transistor arrangement, the second output may be further electrically coupled to a drain terminal of one n-type transistor in the second n-type transistor arrangement, a gate terminal of one p-type transistor in the connecting p-type transistor arrangement and a gate terminal of one n-type transistor in the second n-type transistor may be controlled by a first of two complementary inputs, a gate terminal of one n-type transistor in the connecting n-type transistor arrangement and a gate terminal of one p-type transistor in the second p-type transistor arrangement may be controlled by a second of two complementary inputs, and a source terminal of one p-type transistor in the second p-type transistor arrangement may be electrically coupled to $V_{DD}$, and a source terminal of one n-type transistor in the second n-type transistor arrangement may be electrically coupled to $V_{SS}$.

The circuit may further comprise a third sub-circuit comprising a last p-type transistor arrangement configured to generate a third output and a last n-type transistor arrangement configured to generate a fourth output, the first output may be connected to a gate terminal of one p-type transistor in the last p-type transistor arrangement, the second output may be connected to a gate terminal of one n-type transistor in the last n-type transistor arrangement, and a source terminal of one p-type transistor in the last p-type transistor arrangement may be electrically coupled to $V_{DD}$, and a source terminal of one n-type transistor in the last n-type transistor arrangement may be electrically coupled to $V_{SS}$.

The last p-type transistor arrangement may comprise two p-type transistors connected in series and the last n-type transistor arrangement may comprise two n-type transistors connected in parallel.

A reset signal may be input to a gate of one of the two p-type transistors in the last p-type transistor arrangement and input to a gate of one of the two n-type transistors in the last n-type transistor arrangement.

The last p-type transistor arrangement may comprise two p-type transistors connected in parallel and the last n-type transistor arrangement may comprise two n-type transistors connected in series.

A set signal may be input to a gate of one of the two p-type transistors in the last p-type transistor arrangement and input to a gate of one of the two n-type transistors in the last n-type transistor arrangement.

The first p-type transistor arrangement may receive a first input to control the first output, and the first n-type transistor arrangement may receive a second input to control the second output.

The first input and the second input may be a same one input.

A third input may control the connecting p-type transistor arrangement, and a fourth input may control the connecting n-type transistor arrangement.

The first p-type transistor arrangement may comprise at least first and second p-type transistors, the first and second p-type transistors may be connected in one of: series or parallel.

The first p-type transistor arrangement may further comprise a third p-type transistor, the third p-type transistor may be connected in series with the first and second p-type transistors when the first and second p-type transistors are connected in parallel, and the third p-type transistor may be connected in parallel with the first and second p-type transistors when the first and second p-type transistors are connected in series.

The first n-type transistor arrangement may comprise at least first and second transistors, the first and second n-type transistors may be connected in one of: series or parallel.

The first n-type transistor arrangement may further comprise a third n-type transistor, the third n-type transistor may be connected in series with the first and second n-type transistors when the first and second n-type transistors are connected in parallel, and the third n-type transistor may be connected in parallel with the first and second n-type transistors when the first and second n-type transistors are connected in series.

The third output and the fourth output may be electrically coupled to generate a one output.

The circuit may further comprise: a write data signal; a read control signal; a bitline signal; a write sub-circuit comprising two p-type transistors connected in series between $V_{DD}$ and the third output and two n-type transistors connected in series between $V_{SS}$ and the fourth output; and a read sub-circuit comprising two n-type transistors connected in series between $V_{SS}$ and the bitline signal; wherein the third input controls one of the two n-type transistors of the write sub-circuit, the fourth input controls one of the two p-type transistors of the write sub-circuit, the write data signal controls the other of the two p-type transistors of the write sub-circuit and the other of the two n-type transistors of the write sub-circuit, the third output and the fourth output may be electrically coupled to each other and to the two p-type transistors of the write sub-circuit and to the two n-type transistors of the write sub-circuit, the third output and the fourth output control one of the two n-type transistors of the read sub-circuit, and the read control signal controls the other of the two n-type transistors of the read sub-circuit.

The circuit may further comprise: a write data signal; a read control signal; a bitline signal; a write sub-circuit comprising two p-type transistors connected in series between $V_{DD}$ and the third output and two n-type transistors connected in series between $V_{SS}$ and the fourth output; and a read sub-circuit comprising two n-type transistors connected in series between $V_{SS}$ and the bitline signal, wherein the last p-type transistor arrangement may comprise a number of p-type transistors connected in series, the last n-type transistor arrangement may comprise a number of n-type transistors connected in series, a p-type transistor in the last p-type transistor arrangement and a n-type transistor in the last n-type transistor arrangement may be connected in series and their gate terminals may be connected to $V_{SS}$ and $V_{DD}$ respectively, the third input controls one of the two n-type transistors of the write sub-circuit, the fourth input controls one of the two p-type transistors of the write sub-circuit, the write data signal controls the other of the two p-type transistors of the write sub-circuit and the other of the two n-type transistors of the write sub-circuit, the third output may be electrically coupled to the first input, to the two p-type transistors of the write sub-circuit, and to the last p-type transistor arrangement, the fourth output may be electrically coupled to the second input, to the two n-type transistors of the write sub-circuit, and to the last n-type transistor arrangement, and controls one of the two n-type transistors of the read sub-circuit, and the read control signal controls the other of the two n-type transistors of the read control circuit.

According to a second aspect, there is provided a circuit arrangement comprising a plurality of the circuit of the first aspect electrically coupled to each other.

The reset signal may be input to at least one of the plurality of the circuit.

The set signal may be input to at least one of the plurality of the circuit.

The plurality of the circuit may comprise a first circuit and a second circuit; the one output of the first circuit may be electrically coupled to the one input of the second circuit and to the one output of the second circuit; the first of the two complementary inputs of the first circuit may be electrically coupled to the second of the two complementary inputs of the second circuit; and the second of the two complementary inputs of the first circuit may be electrically coupled to the first of the two complementary inputs of the second circuit.

The plurality of the circuit may comprise a first circuit, a second circuit, a third circuit and a fourth circuit; the one output of the first circuit may be electrically coupled to the one input of the second circuit, to the one output of the second circuit, and to the one input of the third circuit, the one output of the third circuit may be electrically coupled to the one input of the fourth circuit and to the one output of the fourth circuit; the first of the two complementary inputs of the first circuit may be electrically coupled to the second of the two complementary inputs of the second circuit, to the second of the two complementary inputs of the third circuit, and to the first of the two complementary inputs of the fourth circuit; and the second of the two complementary inputs of the first circuit may be electrically coupled to the first of the two complementary inputs of the second circuit, to the first of the two complementary inputs of the third circuit, and to the second of the two complementary inputs of the fourth circuit.

This summary does not describe an exhaustive list of all aspects of the presently disclosed circuit for mitigating SETs. It is anticipated that the presently disclosed circuit includes all methods, apparatus and systems that can be practiced from all appropriate combinations and permutations of the various aspects in this summary, as well as that delineated below. Such combinations and permutations may have specific advantages not specially described in this summary.

BRIEF DESCRIPTION OF FIGURES

In order that the invention may be fully understood and readily put into practical effect, there shall now be described by way of non-limitative example only exemplary embodiments of the present invention, the description being with reference to the accompanying illustrative drawings.

DETAILED DESCRIPTION

Figure 1A:
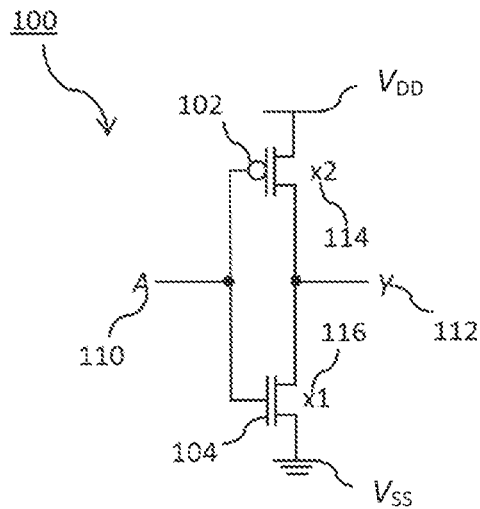
FIG. 1A (prior art) is a schematic diagram of an existing conventional inverter.

The following detailed description refers to the accompanying drawings that show, by way of illustration, specific details and embodiments in which a presently disclosed circuit for mitigating SETs may be practiced. These embodiments are described in sufficient detail to enable those skilled in the art to practice the circuit. Other embodiments may be utilized, and structural, logical, electrical and input changes may be made without departing from the scope of the invention. The various embodiments are not necessarily mutually exclusive, as some embodiments can be combined with one or more other embodiments to form new embodiments.

Embodiments described in the context of one of the circuits or designs are analogously valid for the other circuits or designs. Similarly, embodiments described in the context of a design are analogously valid for a circuit, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the term "about" as applied to a numeric value encompasses the exact value and a reasonable variance.

As used herein, the term "and/or" includes any and all combinations of one or more of the associated listed items. Also, as used herein, the phrase of the form of "at least one of A or B" may include A or B or both A and B.

Various embodiments may provide ultra-low error-rate circuits (e.g. digital circuits with various transistor configurations), and ultra-low error-rate circuit arrangements (e.g. multiple digital circuits arranged to perform a specific function).

Various embodiments may relate to a resistive network technique to charge/discharge a capacitive load within circuits, and may pertain to RHBD techniques to mitigate SEEs in digital (logical) gates, for example, for high-rel applications including space and autonomous vehicles.

Various embodiments may provide a resistive network technique to virtually eliminate any SETs. For example, various embodiments may a provide resistive network technique for digital circuits where the included charges caused high energy particles (e.g. heavy ions) may unlikely to cause any soft errors for digital circuits. The technique may address the limitations of the known transistor up-sizing and other RHBD techniques for digital circuits.

Various embodiments may include a digital circuit design having at least one transistor whose terminals may include a gate terminal, a source terminal and a drain terminal. The gate terminal of the transistor may be configured to control the transistor either by electrically connecting the source terminal and the drain terminal, or by isolating the source terminal and the drain terminal.

The source terminal and the drain terminal of the transistor may be interchangeable. For simplicity, the drain terminal may refer to an output of the transistor.

Various embodiments may include a digital circuit design having at least one transistor whose transistor sizing (i.e. the width over length (W/L) ratio) is up-sized.

Various embodiments may include different types of transistors, including bulk CMOS, silicon-in-insulator (SOI), FinFET, etc. A transistor may be an n-type transistor where its well/substrate is a p-type material and its diffusion regions are n-type materials. The n-type transistor may include an NMOS transistor. A transistor may be a p-type transistor where its well/substrate is an n-type material and its diffusion regions are p-type materials. The p-type transistor may include a PMOS transistor. In the description, for simplicity, the terms NMOS and PMOS transistors are used respectively to refer to n-type and p-type transistors.

Various embodiments may include networks of transistors. A network may include at least one transistor. For a network of having two and more transistors, the transistors may be arranged connected in parallel or in series or a combination of both.

Figure 4:
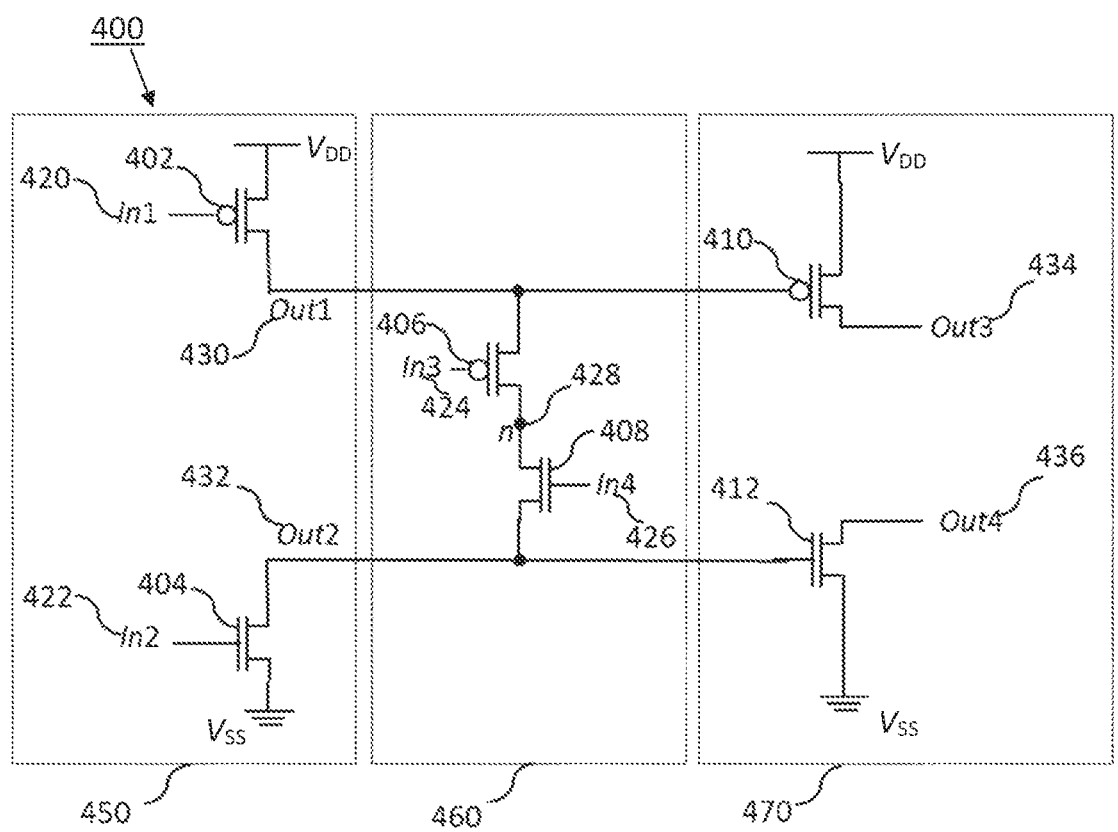
FIG. 4 is a schematic diagram of an exemplary embodiment of a circuit for mitigating SETs.

FIG. 4 depicts an exemplary embodiment of a circuit 400 for mitigating SETs that may be configured for use in various applications as will be described in greater detail below. The circuit 400 comprises a first sub-circuit 450, a second sub-circuit 460 and a third sub-circuit 470. In alternative embodiments, the first sub-circuit 450 and second sub-circuit 460 may form another circuit. The first sub-circuit 450 comprises a first PMOS transistor arrangement 402 and a first NMOS transistor arrangement 404. The second sub-circuit 460 comprises a connecting PMOS transistor arrangement 406 and a connecting NMOS transistor arrangement 408 that are connected in series. The third sub-circuit 470 comprises a PMOS output transistor arrangement 410 and an NMOS output transistor arrangement 412, also referred to as the last PMOS transistor arrangement 410 and the last NMOS transistor arrangement 412 respectively. In this embodiment, each PMOS transistor arrangement comprises only one PMOS transistor and each NMOS transistor arrangement comprises only one NMOS transistor. In other embodiments, each PMOS or NMOS transistor arrangement may comprise one or multiple PMOS or NMOS transistors respectively, as will be described in greater detail below.

The input In1 420 controls the first PMOS transistor 402 to generate a first output Out1 430, and the input In2 422 controls the first NMOS transistor 404 to generate a second output Out2 432. In the second sub-circuit 460, the first output Out1 430 and the second output Out2 432 are connected through the series-connected connecting PMOS transistor arrangement 406 and connecting NMOS transistor arrangement 408. The source terminal of the connecting PMOS transistor arrangement 406 is connected to the first output Out1 430, and the source terminal of the connecting NMOS transistor arrangement 408 is connected to the second output Out2 432. The first output Out1 430 further controls the last PMOS transistor 410 to generate a third output Out3 434. The second output Out2 432 further controls the last NMOS transistor 412 to generate a fourth output Out4 436. The input In3 424 controls the connecting PMOS transistor arrangement 406, and the input In4 426 controls the connecting NMOS transistor arrangement 408. The drain of the connecting PMOS transistor arrangement 406 and the drain of the connecting NMOS transistor arrangement 408 are connected, having an intermediate signal n 428. The source terminal of the first PMOS transistor 402 and the source terminal of the last PMOS transistor 410 are connected to a supply voltage $V_{DD}$. The source terminal of the connecting NMOS transistor arrangement 402 and the source terminal of the last NMOS transistor 412 are connected to the ground $V_{SS}$. Depending on the input and output configuration and/or the associated augmentation of transistors/other circuits, different embodiments of the circuit 400 may be realized for various functionalities. For example, each of the PMOS transistors 402, 406, 410 may (whether PMOS or NMOS) 402, 404, 406, 408, 410, 412 may be provided as a network having one or more transistors.

The connecting PMOS transistor arrangement 406 and the connecting NMOS transistor arrangement 408 in the second sub-circuit 460 form a resistive network when both these transistors 406, 408 are on. The signals Out1 430 and Out2 432 are electrically connected via the second sub-circuit 460.

Figure 5:
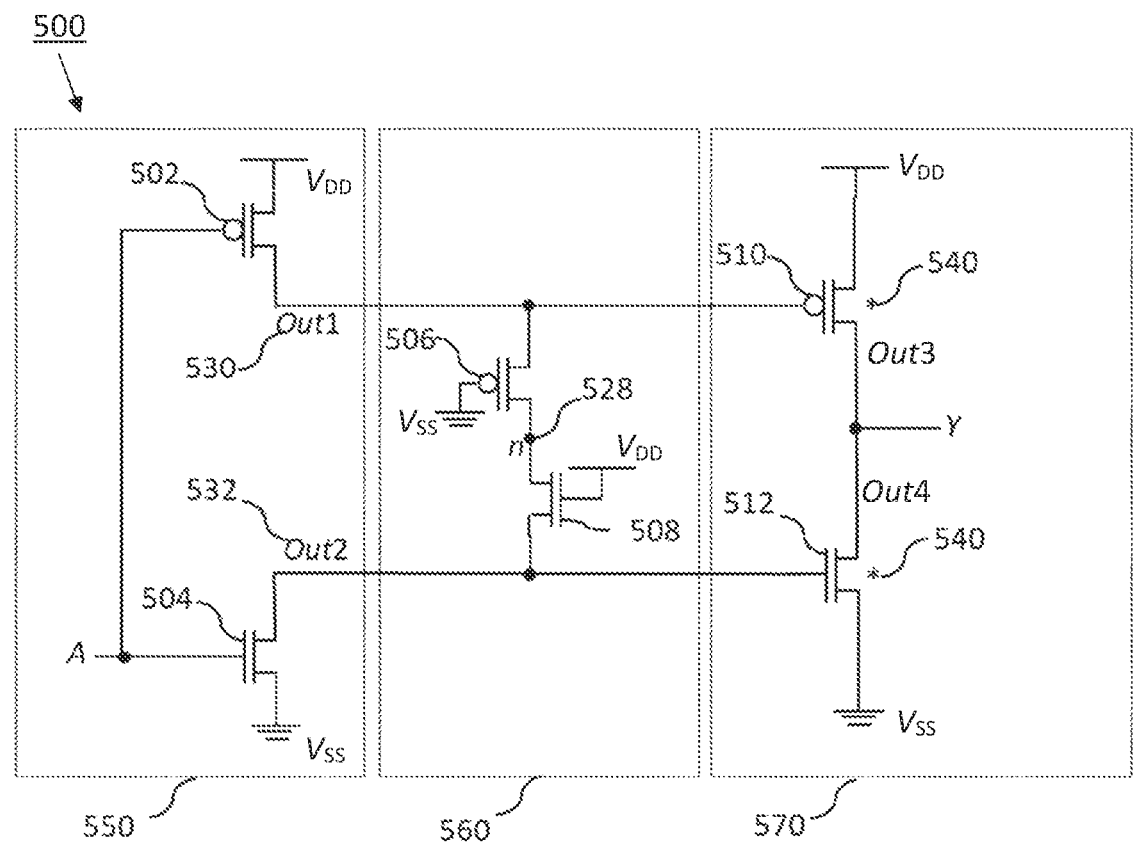
FIG. 5 is a schematic diagram of an exemplary embodiment of a circuit for mitigating SETs configured as a buffer.

FIG. 5 depicts an exemplary embodiment of a circuit 500 for mitigating SETs configured as a buffer 500. The buffer 500 has an input and an output Y that should be at a same logic state as the input A. The buffer 500 comprises a first sub-circuit 550, a second sub-circuit 560 and a third sub-circuit 570. The first sub-circuit 550 comprises a first PMOS transistor arrangement 502 and a first NMOS transistor arrangement 504. The second sub-circuit 560 comprises a connecting PMOS transistor arrangement 506 and a connecting NMOS transistor arrangement 508. The third sub-circuit 570 comprises the last PMOS transistor arrangement 510 and the last NMOS transistor arrangement 512 respectively. In this embodiment, each PMOS transistor arrangement comprises only one PMOS transistor and each NMOS transistor arrangement comprises only one NMOS transistor.

The input A controls the first PMOS transistor 502 to generate a first intermediate signal Out1 530 and controls the first NMOS transistor 504 to generate a second intermediate signal Out2 532. The signals Out1 530 and Out2 532 are connected through the second sub-circuit 560 comprising the connecting PMOS transistor arrangement 506 and the connecting NMOS transistor arrangement 508 connected in series. The source terminal of the connecting PMOS transistor arrangement 506 is connected to the signal Out1 530, and the source terminal of the connecting NMOS transistor arrangement 508 is connected to the signal Out2 532. The signal Out1 530 further controls the last PMOS transistor 510 to generate a third output Out3. The signal Out2 532 further controls the last NMOS transistor 512 to generate a fourth output Out4. The third output Out3 is electrically coupled to the fourth output Out4 to generate the one output Y. The gate terminal of the connecting PMOS transistor arrangement 506 is connected to the ground $V_{SS}$, and the gate terminal of the connecting NMOS transistor arrangement 508 is connected to a supply voltage $V_{DD}$. Both the connecting PMOS transistor arrangement 506 and the connecting NMOS transistor arrangement 508 are on. The drain terminal of the connecting PMOS transistor arrangement 506 and the drain terminal of the connecting NMOS transistor arrangement 508 are connected, having an intermediate signal n 528. The source terminal of the first PMOS transistor 502 and the source terminal of the last PMOS transistor 510 are connected to $V_{DD}$. The source terminal of the first NMOS transistor 502 and the source terminal of the last NMOS transistor 512 are connected to $V_{SS}$.

Note that the last PMOS transistor 510 and the last NMOS transistor 512 are preferably up-sized for mitigating SETs; upsized transistors are labeled with asterisks (*) 540. The size of the last PMOS transistor 510 and the last NMOS transistor 512 may depend on how much critical charge changed per unit chord length is desired. Other transistors 502, 504, 506 and 508 may not require up-sizing.

When the input A is at logic '0', this causes the first NMOS transistor 504 to be off and the first PMOS transistor 502 to be on. The first PMOS transistor 502 charges the signal Out1 530 to logic '1', and also charges the signals n 528 and Out2 532 to logic '1' via the second sub-circuit 560. The signals Out1 530 and n 528 are at strong logic '1' having a full voltage level of $V_{DD}$, and the signal Out2 532 is at weak logic '1' having a voltage level of $V_{DD}-V_{tn}$ (due to a threshold voltage drop across the connecting NMOS transistor arrangement 508, the threshold voltage of an NMOS transistor being termed as $V_{tn}$). The last PMOS transistor 510 is turned off, and the last NMOS transistor 512 is turned on, discharging the output Y to be at logic '0' (i.e., the same logic as A).

Similarly, when the input A is at logic '1', this causes the first PMOS transistor 502 off and the first NMOS transistor 504 on. The first NMOS transistor 504 discharges Out2 532 to logic '0', and also discharges the signals n 528 and Out1 530 to logic '0' via the second sub-circuit 560. The signals Out2 532 and n 528 is at strong logic '0' having a 0V voltage (i.e., ground), and the signal Out1 530 is at weak logic '0' having a voltage level of $V_{tp}$ (due to a threshold voltage across the connecting PMOS transistor arrangement 506, the threshold voltage of a PMOS transistor being termed as $V_{tp}$). The last NMOS transistor 512 is turned off, and the last PMOS transistor 510 is turned on, charging the output Y to be at logic '1' (i.e., the same logic as A).

It will now be described how the buffer 500 depicted in FIG. 5 is able to mitigate SETs. An energized particle may hit the buffer circuit 500 at any of the locations of the output Y, of the signals Out1 530, n 528 and Out2 532, and of the input A, and cause an SET to occur at the location. Consider a case where an SET occurs at the location of the output Y. To prevent the SET at Y, the last PMOS transistor 510 and the last NMOS transistor 512 need to be up-sized so that these two transistors 510, 512 have a large current drivability to counteract any induced charges. The larger the transistor sizing for the transistors 510 and 512, the higher resistance to SET (at the cost of higher power dissipation and larger area).

Consider a case where an SET occurs at any of the locations of the signals Out1 530, n 528 and Out2 532. In a first scenario where the input A is at logic '0', the internal signals Out1 530, n 528 and Out2 532 will be logic '1' to result in the output Y being at logic '0'. To induce an output Y error of logic '1', the last PMOS transistor 510 needs to be turned on by having a logic '0' at the signal Out1 530. Should an SET occur at the signal Out1 530, because the signal Out1 530 is connected with the drain terminal of the first PMOS transistors 502 and with the source terminal of the second PMOS 506, a negative SET will not be induced at the signal Out1 530 as these transistors 502, 506 are PMOS transistors. Should an SET occur at the drain terminal of the connecting NMOS transistor arrangement 508, a negative SET could be induced at the signal n 528. However, any induced negative charges on the signal n 528 are distributed across the signals Out1 530 and Out2 532. Through the charge distribution, the voltage on the signal Out1 530 will be unlikely to change from logic '1' to logic '0', hence the last PMOS transistor 510 is unlikely to be turned on, thereby preventing an output Y error of logic '1'. Even if an SET occurs at the signal Out2 532, the induced negative charges are unlikely be able to cross over the signal n 528 to reach the signal Out1 530 and turn the last PMOS transistor 510 on to result in an output Y error of logic '1'. The transistor sizing for the PMOS transistors 502 and 506 are used to limit the charge sharing from the signal n 528 to the signal Out1 530. Particularly, the first PMOS transistor 502 has a larger drivability than that of the connecting PMOS transistor arrangement 506. This is achieved by keeping the aspect ratio W/L of the first PMOS transistor 502 to be the standard size, but by making the connecting PMOS transistor arrangement 506 to be weak by having a large L. Alternatively, the W/L of the connecting PMOS transistor arrangement 506 may be kept at the standard size, but the first PMOS transistor 502 may be made strong by having a large W.

Similarly, in a second scenario where the input A is at logic '1', the internal signals Out1 530, n 528 and Out2 532 will be at logic '0' to result in the output Y being at logic '1'. To induce an output error of logic '0', the last NMOS transistor 540 needs to be turned on by having a logic '1' at the signal Out2 532. Should an SET occur at the signal Out2 532, because the signal Out2 532 is connected with only the drain terminal of the first NMOS transistor 504 and the source terminal of the connecting NMOS transistor arrangement 508, a positive SET will not be induced as these transistors 504, 508 are NMOS transistors. Should an SET occur at the drain terminal of the connecting PMOS transistor arrangement 506, a positive SET could be induced at the signal n 528. However, any induced positive charges on the signal n 528 are distributed across the signals Out1 530 and Out2 532. Through the charge distribution, the voltage on the signal Out2 532 will be unlikely to change from logic '0' to logic '1', hence the last NMOS transistor 512 is unlikely to be turned on, thereby preventing an output Y error of logic '0'. Even if an SET occurs at the signal Out1 530, the induced positive charges are unlikely to be able to cross over the signal n 528 to reach the signal Out2 532 and turn the last NMOS transistor 512 on to result in an output Y error of logic '0'. The transistor sizing for the NMOS transistors 504 and 508 is used to limit the charge sharing from the signal n 528 to the signal Out2 532. Particularly, the first NMOS transistor 504 has a larger drivability than that of the connecting NMOS transistor arrangement 508. This is achieved by keeping the aspect ratio W/L of the first NMOS transistor 504 to be the standard size, but by making the connecting NMOS transistor arrangement 508 weak by having a large L. Alternatively, the W/L of the connecting NMOS transistor arrangement 508 may be kept to the standard size, but the first NMOS transistor 504 may be made strong by having a large W.

For low area considerations, the connecting PMOS transistor arrangement 506 and the connecting NMOS transistor arrangement 508 in the second sub-circuit 560 preferably have a weak driving capability, i.e., by having a larger L for these two transistors 506 and 508.

Figure 1B:
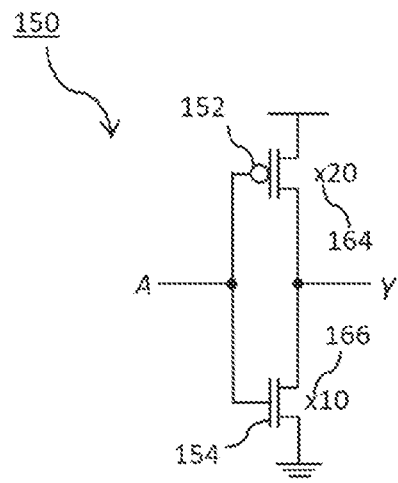
FIG. 1B (prior art) is a schematic diagram of an existing RHBD inverter.
Figure 2A:
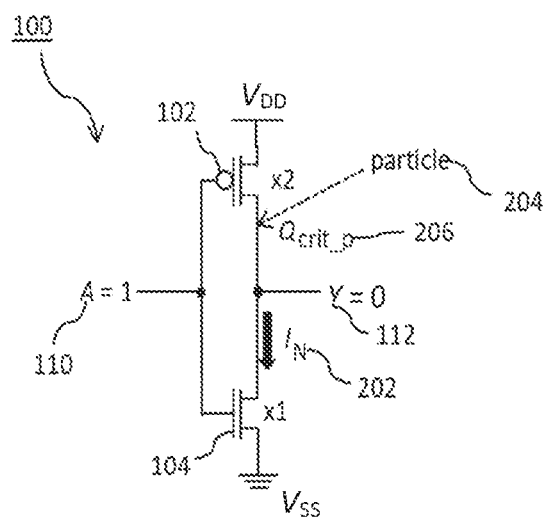
FIG. 2A (prior art) is a schematic diagram showing how a single-event-transient (SET) may be generated under a first operation scenario of the inverter of FIG. 1A.
Figure 2B:
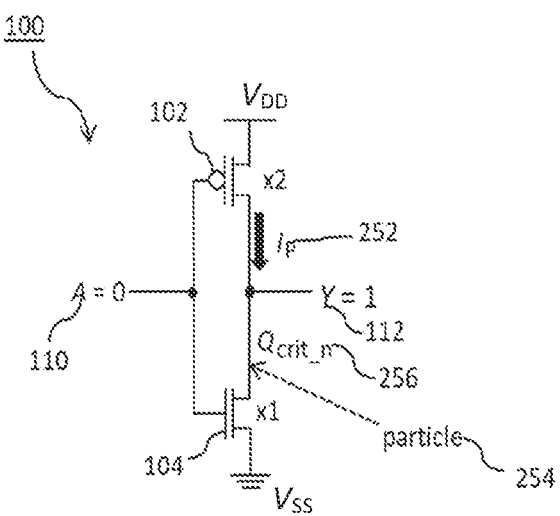
FIG. 2B (prior art) is a schematic diagram showing how a single-event-transient (SET) may be.
Figure 3:
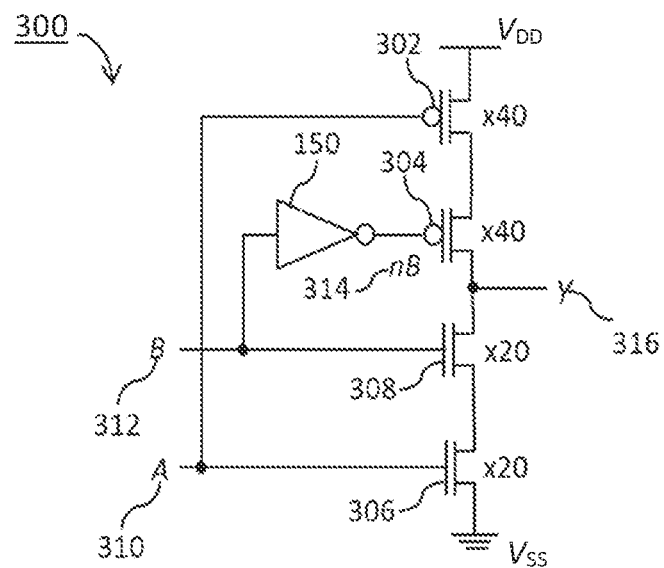
FIG. 3 (prior art) is a schematic diagram of an existing tristate inverting buffer.

In a case where an SET occurs at the input A, the SET pulse may be mitigated by having an up-sized driving circuit to drive the input A. The driving circuit may be an RHBD inverter 150 as depicted in FIG. 1B.

Put simply, as long as the input A and output Y are driven by the large current drivability transistors (e.g. the transistors 152 and 154 in FIG. 1B as a driving circuit for the input A and the transistors 510 and 512 in FIG. 5 for the one output Y), the RHBD buffer circuit 500 in FIG. 5 is unlikely to be affected by any SETs without requiring all the other transistors in the circuit 500 to be upsized. Particularly, the signals Out1 530, n 528 and Out2 532 are in part protected by the second sub-circuit 560 so that the transistors 510 and 512 in the third sub-circuit 570 are unlike to be accidentally triggered by SETs.

In alternative embodiments, each transistor 502, 504, 506, 508, 510, 512 described above with reference to FIG. 5 may be embodied as a network comprising a plurality of transistors. For example, the first PMOS transistor 502 may be embodied as a first PMOS network. The first NMOS transistor 504 may be embodied as a first NMOS network. The connecting PMOS transistor arrangement 506 may be embodied as a second PMOS network. The connecting NMOS transistor arrangement 508 may embodied as a second NMOS network. The last PMOS transistor 510 may embodied as a last PMOS network. The last NMOS transistor 512 may be embodied as a last NMOS network. Each of the first, second, third and last PMOS networks comprises a plurality of PMOS transistors. Each of the first, second, third and last NMOS networks comprises a plurality of NMOS transistors.

Figure 6:
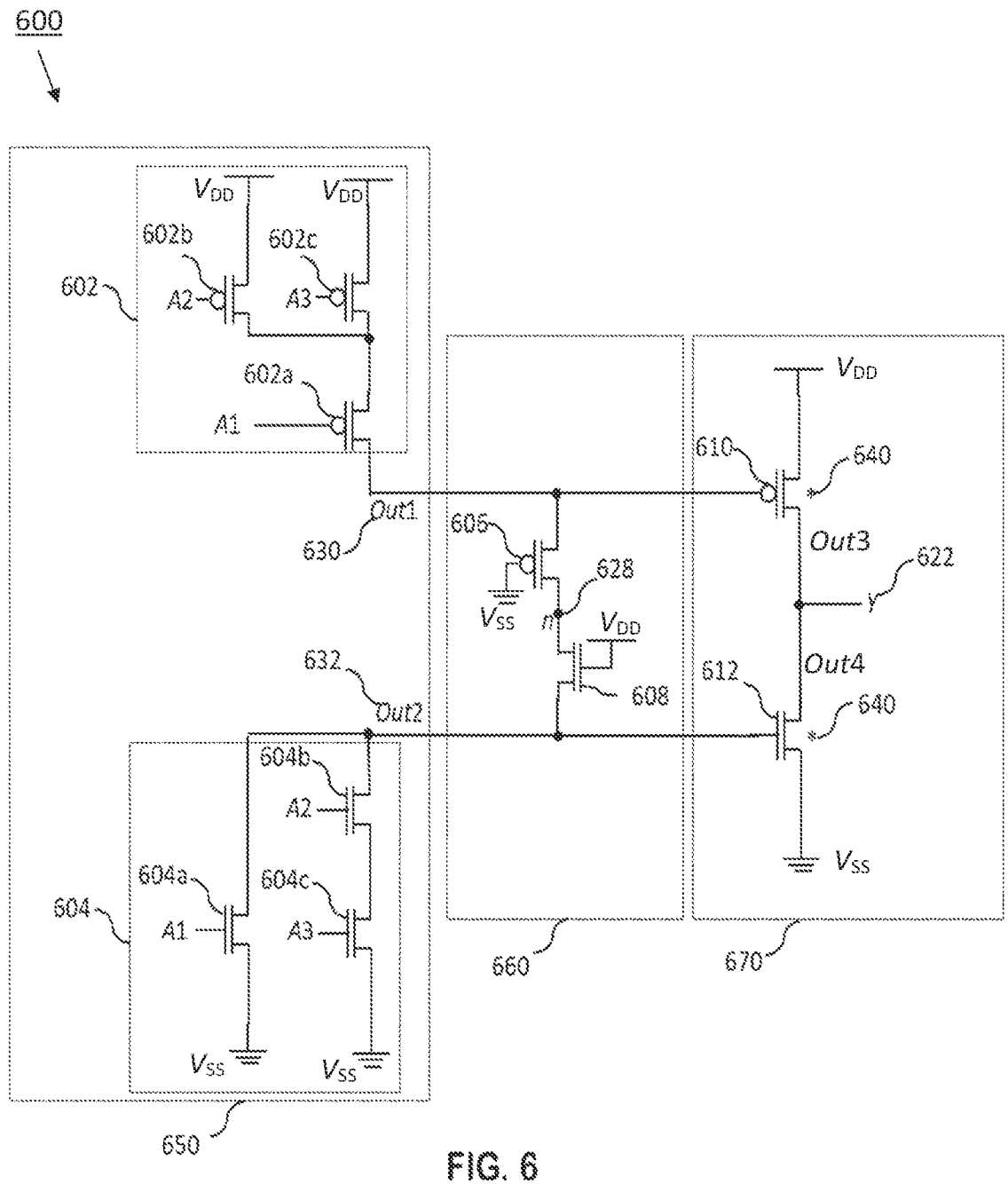
FIG. 6 is a schematic diagram of an exemplary embodiment of a circuit for mitigating SETs configured as a complex-gate.

FIG. 6 depicts another exemplary embodiment of a circuit 600 for mitigating SETs configured as a complex-gate to perform AND-OR operations. The circuit 600 comprises a first sub-circuit 650, a second sub-circuit 660 and a third sub-circuit 670. The first sub-circuit 650 receives a set of inputs signal, i.e. A1, A2, and A3. The first sub-circuit 650 comprises a first PMOS transistor arrangement 602 and a first NMOS transistor arrangement 604. The second sub-circuit 660 comprises a connecting PMOS transistor arrangement 606 and a connecting NMOS transistor arrangement 608 respectively that each comprise only one PMOS transistor 606 and only one NMOS transistor 608 respectively. The third sub-circuit 670 comprises the last PMOS transistor arrangement 610 and the last NMOS transistor arrangement 612 respectively that each comprise only one last PMOS transistor 610 and only one last NMOS transistor 612 respectively.

The first PMOS transistor arrangement 602 comprises a network of three PMOS transistors 602a, 602b, 602c. The PMOS transistors 602b and 602c are connected in parallel with each other. The transistor PMOS 602a is connected in series with the PMOS transistors 602b and 602c. The PMOS transistors 602a, 602b, and 602c together form a pull-up network which are grouped and collectively serve as the first PMOS transistor arrangement 602.

The first NMOS transistor arrangement 604 comprises a network of three NMOS transistors 604a, 604b, 604c. The transistors 604b and 604c are connected in series, and are together connected in parallel with the transistor 604a. The NMOS transistors 604a, 604b, and 604c together form a pull-down network which are grouped and collectively serve as the first NMOS transistor 604.

The input A1 controls the PMOS transistor 602a and the NMOS transistor 604a. The input A2 controls the PMOS transistor 602b and the NMOS transistor 604b. The input A3 controls the PMOS transistor 602c and the NMOS transistor 604c. The PMOS transistors 602a, 602b, and 602c drive the signal Out1 630 and control the gate terminal of the last PMOS transistor 610 to generate a third output Out3. The NMOS transistors 604a, 604b, and 604c drive the signal Out2 632 and control the gate terminal of the last NMOS transistor 612 to generate a fourth output Out4. The third output Out3 is electrically coupled to the fourth output Out4 to generate the one output Y 622.

The connecting PMOS transistor arrangement 606 and the connecting NMOS transistor arrangement 608 are connected in series with their drains connected so that the connecting PMOS transistor arrangement 606 and the connecting NMOS transistor arrangement 608 serve as a resistive network to mitigate SET such that any SET will not affect the last PMOS transistor 640 or the last NMOS transistor 612. The SET protection mechanism to the internal signals Out1 630, n 628 and Out2 632 is the same as described above in FIG. 5. The circuit design 600 in FIG. 6 may perform AND-OR operations where the inputs A2 and A3 may have an AND function which may collectively have an OR function with the input A1.

In alternative embodiments of the circuit 600 (not shown), the first p-type transistor arrangement 602 may comprise a number (e.g. two) p-type transistors connected in series or parallel, and the first n-type transistor arrangement 604 may comprise a number (e.g. two) n-type transistors connected in series or parallel. Notably, when p-type transistors in the first p-type transistor arrangement 602 are connected in series, n-type transistors in the first n-type transistor arrangement 604 should be connected in parallel. Similarly, when p-type transistors in the first p-type transistor arrangement 602 are connected in parallel, n-type transistors in the first n-type transistor arrangement 604 should be connected in series.

For completeness, in various embodiments of the circuit of the present invention, any functional logic gate may be implemented by providing a pull-up network (e.g. functioning as the first PMOS transistor arrangement 602) and a pull-down network (e.g. functioning as the first NMOS transistor arrangement 604) in the first sub-circuit. For example, the pull-up and pull-down networks may have one, two, three, or any other number of inputs. The first sub-circuit may subsequently control the third sub-circuit to drive the output Y having a split-transistor configuration (e.g., the last PMOS transistor 610 and the last NMOS transistor 612) which is controlled by the second sub-circuit. The second sub-circuit comprises a PMOS transistor (e.g. the connecting PMOS transistor arrangement 606) and an NMOS transistor (e.g. the connecting NMOS transistor arrangement 608) connected in series functioning as a resistive network, and the PMOS transistor of the second sub-circuit is connected to the PMOS pull-up network of the first sub-circuit, and the NMOS transistor of the second sub-circuit is connected to the NMOS pull-down network of the first sub-circuit.

Figure 7:
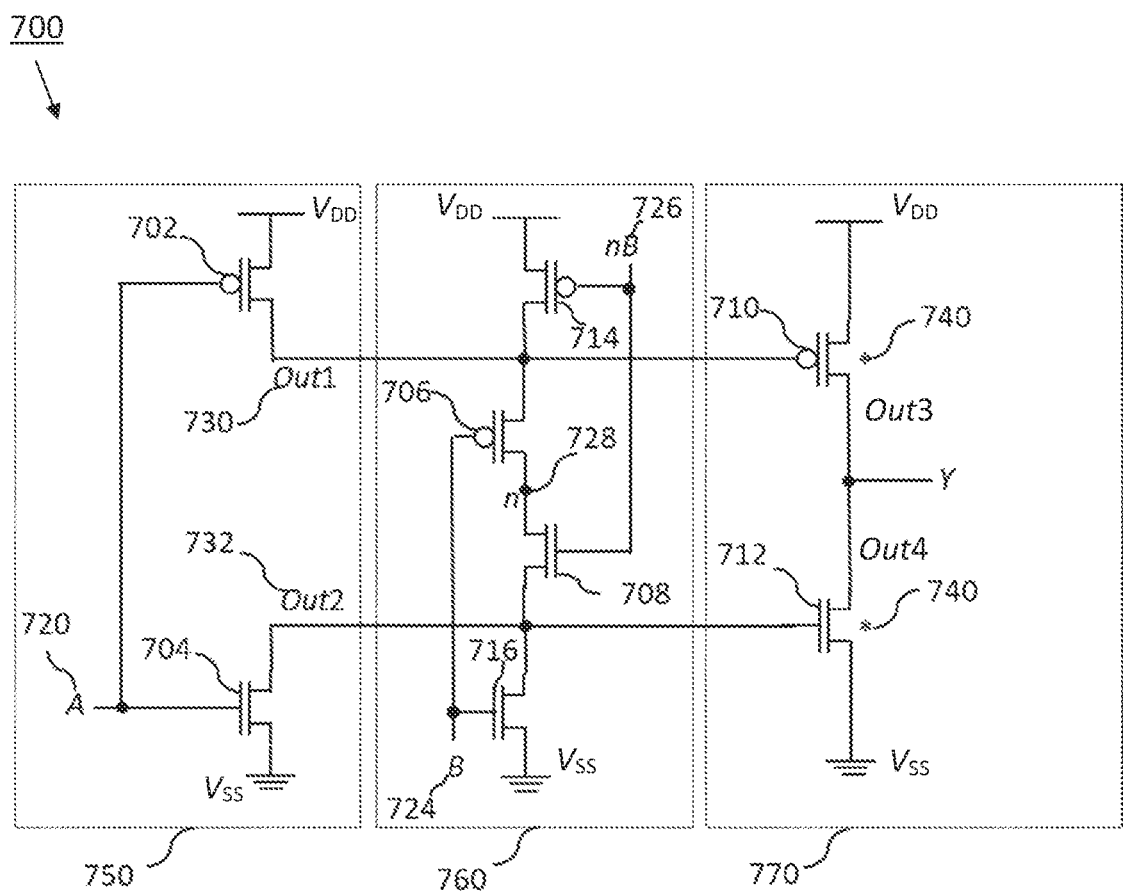
FIG. 7 is a schematic diagram of an exemplary embodiment of a circuit for mitigating SETs configured as a tristate buffer.

FIG. 7 depicts another exemplary embodiment of a circuit 700 for mitigating SETs configured as a tristate buffer 700, somewhat similar to the buffer 500 described above with reference to FIG. 5. The tristate buffer 700 comprises a first sub-circuit 750, a second sub-circuit 760 and a third sub-circuit 770. The first sub-circuit 750 in FIG. 7 is the same as the first sub-circuit 550 shown in FIG. 5. The third sub-circuit 770 in FIG. 7 is the same as the third sub-circuit 570 shown in FIG. 5. However, the second sub-circuit 760 comprises not only the connecting PMOS transistor arrangement 706 and the connecting NMOS transistor arrangement 708 connected in series, but also a second PMOS transistor arrangement 714 and a second NMOS transistor arrangement 716. In this configuration, the connecting PMOS transistor arrangement 706 comprises only one connecting PMOS transistor 706, the connecting NMOS transistor arrangement 708 comprises only one connecting NMOS transistor 708, the second PMOS transistor arrangement 714 comprises only one PMOS transistor 714 and the second NMOS transistor arrangement 716 comprises only one NMOS transistor 716. A source terminal of the second PMOS transistor 714 is connected to the first output Out1 730, and a source terminal of the second NMOS transistor 716 is connected to the second output Out2 732. A gate terminal of the connecting PMOS transistor arrangement 706 and a gate terminal of the second NMOS transistor 716 are controlled by an input 8. The gate terminal of the connecting NMOS transistor arrangement 708 and the gate terminal of the second PMOS transistor 714 are controlled by an input n8 726. The input 8 724 and input n8 726 are complementary. Thus, unlike the second sub-circuits 560, 660 shown in FIGS. 5 and 6 respectively, the inputs 8 724 and n8 726 in the sub-circuit 760 are controllable, and are not permanently tied to $V_{SS}$ and $V_{DD}$ respectively.

When the inputs 8 724 and n8 726 are at logic '0' and '1' respectively, the connecting PMOS transistor arrangement 706 and the connecting NMOS transistor arrangement 708 are on, while the second PMOS transistor 714 and the second NMOS transistor 716 is off. In this case, the tristate buffer 700 may function as a buffer, having the same function and the same strong SET hardness/mitigation as the buffer 500 depicted in FIG. 5.

When inputs B 724 and nB 726 are at logic '1' and '0' respectively, the connecting PMOS transistor arrangement 706 and the connecting NMOS transistor arrangement 708 are off, while the second PMOS transistor 714 and the second NMOS transistor 716 is on. The output Y is in a high impedance state. Note that an SET may not disrupt the internal signals Out1 730, n 728, and Out2 732 to accidentally trigger the last PMOS transistor 710 or the last NMOS transistor 712.

In alternative embodiments (not shown), the each PMOS transistor arrangement may comprise a plurality of PMOS transistors and each NMOS transistor arrangement may comprise a plurality of NMOS transistors.

Figure 8:
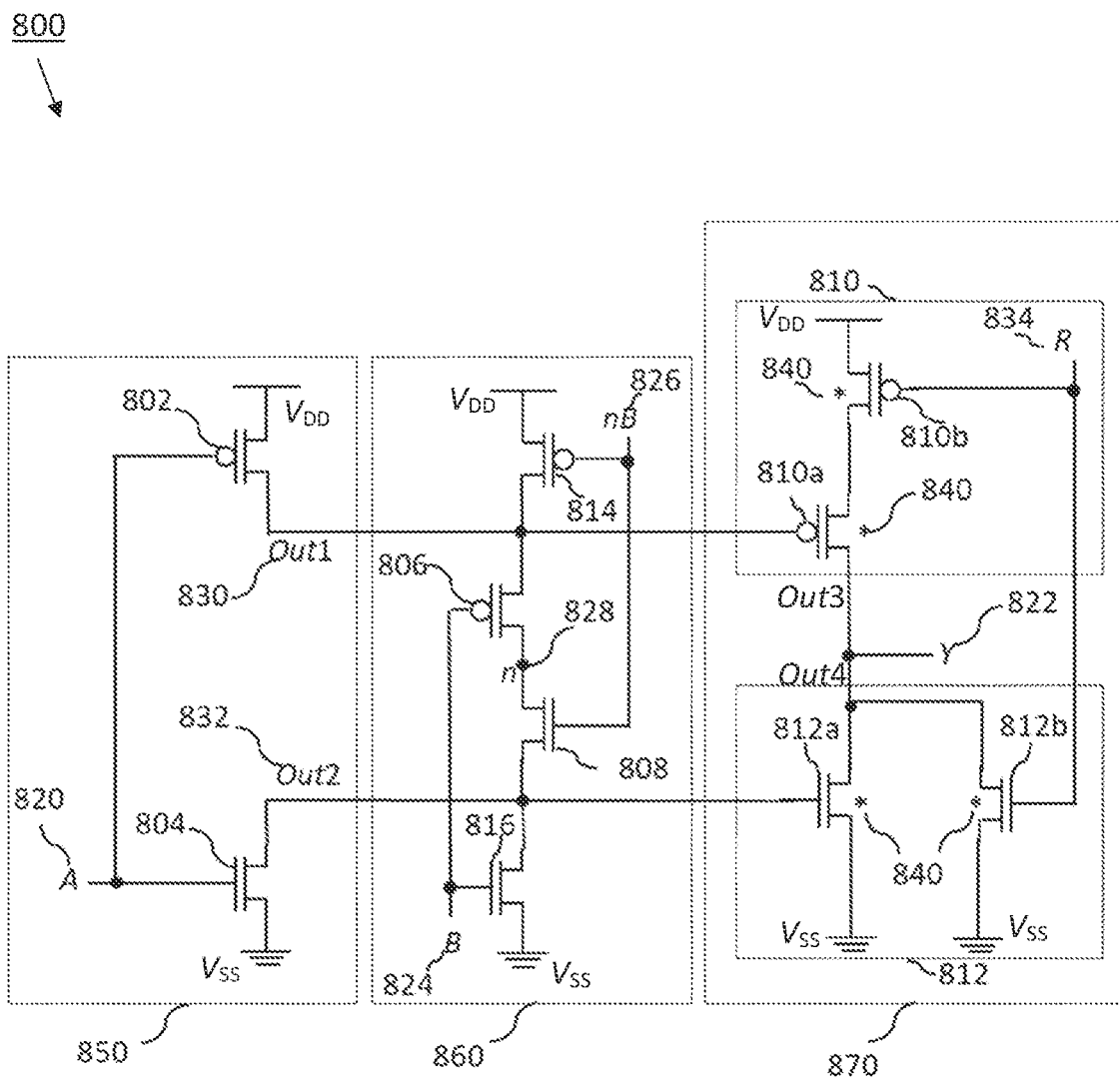
FIG. 8 is a schematic diagram of an exemplary embodiment of a circuit for mitigating SETs configured as a resettable tristate buffer.

FIG. 8 depicts an exemplary embodiment of a circuit 800 for mitigating SETs configured as a resettable tristate buffer 800, somewhat similar to the tristate buffer 700 described above with reference to FIG. 7. The resettable tristate buffer 800 comprises a first sub-circuit 850, a second sub-circuit 860 and the third sub-circuit 870. The first sub-circuit 850 is the same as the first sub-circuit 750 shown in FIG. 7. The second sub-circuit 860 is the same as the second sub-circuit 760 shown in FIG. 7. The third sub-circuit 870 comprises a last PMOS transistor arrangement 810 and a last NMOS transistor arrangement 812. The last PMOS transistor 810 arrangement comprises two PMOS transistors 810a, 810b and generates a third output Out3. The last NMOS transistor arrangement 812 comprises two NMOS transistors 812a, 812b and generates a fourth output Out4. The third output Out3 is electrically coupled to the fourth output Out4 to generate the one output Y 822. The PMOS transistors 810a and 810b are connected in series between $V_{DD}$ and the one output Y 822, while the NMOS transistors 812a and 812b are connected in parallel between $V_{SS}$ and the one output Y 822.

The PMOS transistor 810b and the NMOS transistor 812b are controlled by a reset signal R 834. When the reset signal R 834 is at logic '1', this discharges the output Y 822 to logic '0'—a reset operation. When the reset signal R 834 is at logic '0', then the resettable tristate buffer 800 is functionally the same as the tristate buffer 700 in FIG. 7. To mitigate SETs, the PMOS transistors 810a and 810b and the NMOS transistors 812a and 812b in the third sub-circuit may need to be up-sized (and they are labeled with asterisks (*) 840).

Figure 9:
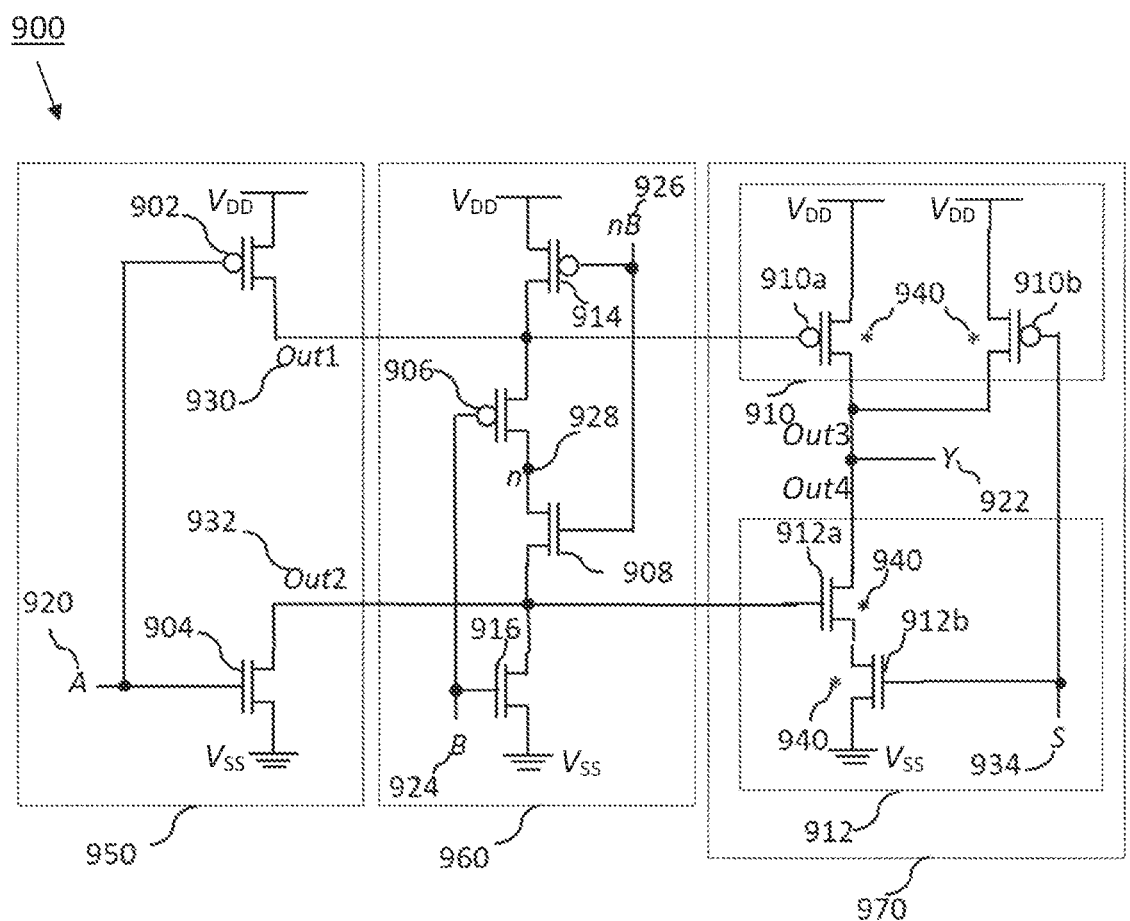
FIG. 9 is a schematic diagram of an exemplary embodiment of a circuit for mitigating SETs configured as a settable tristate buffer.

FIG. 9 depicts an exemplary embodiment of a circuit 900 for mitigating SETs configured as a settable tristate buffer 900, somewhat similar to the resettable tristate buffer 800. The settable tristate buffer 900 comprises a first sub-circuit 950, a second sub-circuit 960 and the third sub-circuit 970. The first sub-circuit 950 is the same as the first sub-circuit 850 shown in FIG. 8. The second sub-circuit 960 is the same as the second sub-circuit 860 shown in FIG. 8. The third sub-circuit 970 comprises a last PMOS transistor arrangement 910 and a last NMOS transistor arrangement 912. The last PMOS transistor arrangement 910 comprises two PMOS transistors 910a, 910b and generates a third output Out3. The last NMOS transistor arrangement 912 comprises two NMOS transistors 912a, 912b and generates a fourth output Out4. The third output Out3 is electrically coupled to the fourth output Out4 to generate the output Y 922. The PMOS transistors 910a and 910b are connected in parallel between $V_{DD}$ and the one output Y922, while the NMOS transistors 912a and 912b are connected in series between $V_{SS}$ and the one output Y 922.

The PMOS transistor 910b and the NMOS transistor 912b are controlled by a set signal S 934. When the set signal S 934 is at logic '0', this charges the output Y922 to logic '1'—a set operation. When the set signal S 934 is at logic '1', the settable tristate buffer 900 is functionally the same as the tristate buffer 700 in FIG. 7. To mitigate SETs, the PMOS transistors 910a and 910b and the NMOS transistors 912a and 912b in the third sub-circuit are preferably up-sized (and they are labeled with asterisks (*) 940).

Figure 10A:
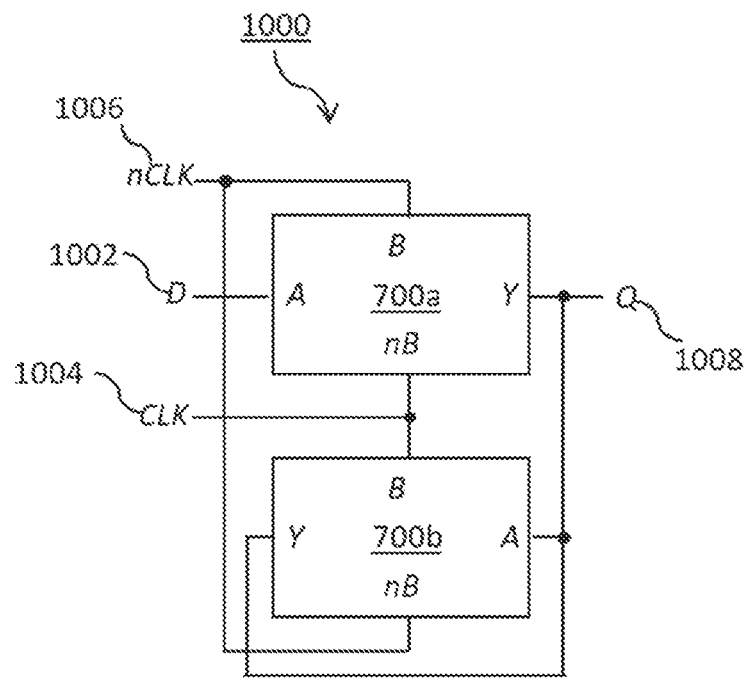
FIGS. 10A, 10B and 10C are schematic diagrams of exemplary embodiments of circuit arrangements to form a latch.

Tristate buffers are the most critical building blocks to constitute a sequential logic, including a latch and a flip-flop. FIG. 10A depicts an exemplary design of a latch 1000 comprising two circuits configured as tristate buffers 700a, 700b which are each the same as the tristate buffer 700 described above with reference to FIG. 7. The two tristate buffers 700a and 700b are connected somewhat in a feedback manner, wherein the one output Y of the first buffer 700a is electrically coupled to the one input A of the second buffer 700b and also to the one output Y of the second buffer 700b, wherein the 8 signal of the first buffer 700a is electrically coupled to the n8 signal of the second buffer 700b, and wherein the 8 signal of the second buffer 700b is electrically coupled to the n8 signal of the first buffer 700a. The inputs are D 1002, CLK 1004 and nCLK 1006, where CLK 1004 and nCLK 1006 are complementary. The output is Q 1008. When CLK 1002 and nCLK 1004 are at logic '1' and logic '0' respectively, the tristate buffer 700a is in the transparent state where the output Q 1008 follows the input D 1002 and the tristate buffer 700b is in the opaque state. Conversely, when CLK 1002 and nCLK 1004 are at logic '0' and logic '1' respectively, the output Q 1008 is maintained by the tristate buffer 700b which is in the transparent state and the tristate buffer 700a is in the opaque state.

Figure 10B:
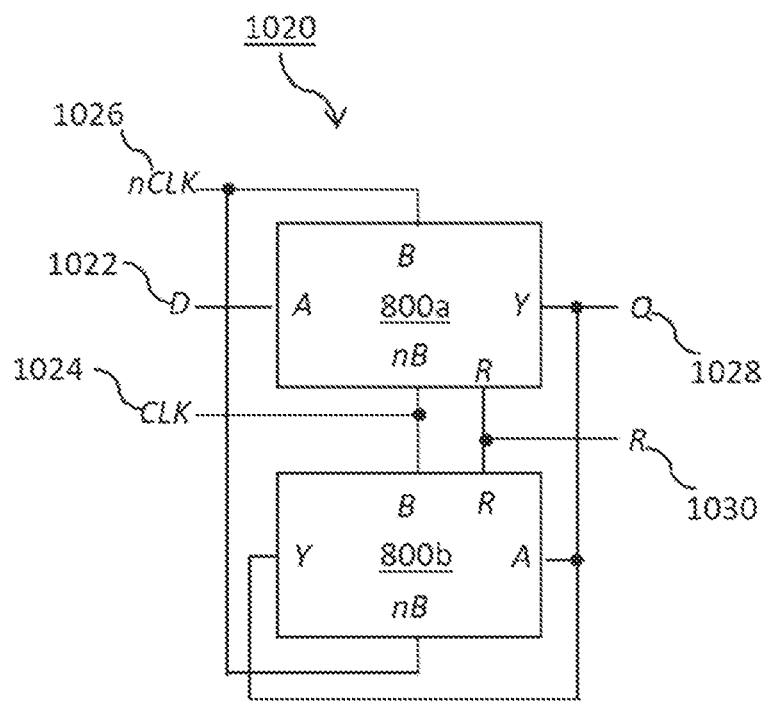

FIG. 10B depicts an exemplary design of a resettable latch 1020 comprising two circuits configured as resettable tristate buffers 800a, 800b which are each the same as the resettable tristate buffer 800 described above with reference to FIG. 8. The two resettable tristate buffers 800a and 800b are connected somewhat in a feedback manner, wherein the one output Y of the first buffer 800a is electrically coupled to the one input A of the second buffer 800b and also to the one output Y of the second buffer 800b, wherein the 8 signal of the first buffer 800a is electrically coupled to the n8 signal of the second buffer 800b, and wherein the 8 signal of the second buffer 800b is electrically coupled to the n8 signal of the first buffer 800a. The inputs are R 1030, D 1022, CLK 1024 and nCLK 1026, where CLK 1024 and nCLK 1026 are complementary. The output is Q 1028. The input R 1030 is at the logic '1' where both two resettable tristate buffers 800a and 800b are reset; the output Q is at the logic '0'. Conversely, the input R 1030 is at the logic '0' where the resettable latch design 1020 is functionally the same as the latch design 1000 depicted in FIG. 10A.

Figure 10C:
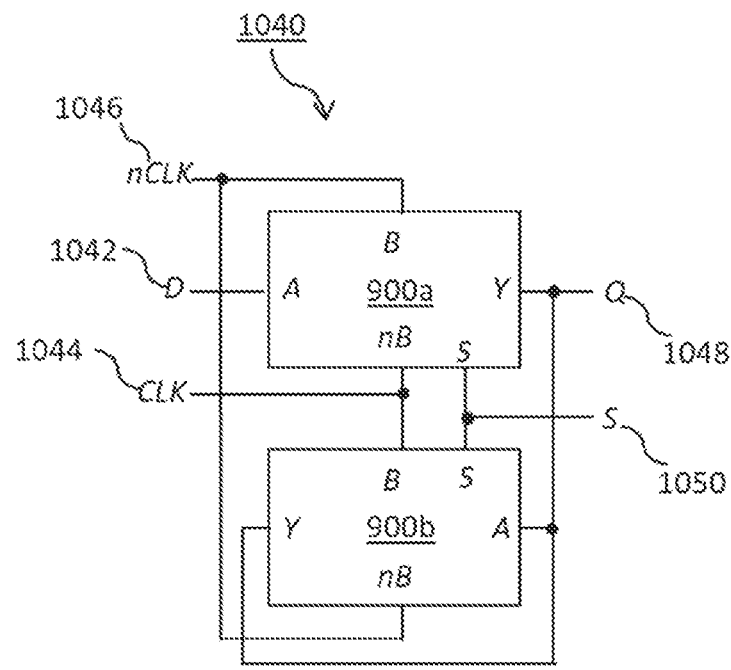

FIG. 10C depicts an exemplary design of a resettable latch 1040 comprising two circuits configured as resettable tristate buffers 900a, 900b which are each the same as the resettable tristate buffer 900 described above with reference to FIG. 9. The two resettable tristate buffers 900a and 900b are connected somewhat in a feedback manner, wherein the one output Y of the first buffer 900a is electrically coupled to the one input A of the second buffer 900b and also to the one output Y of the second buffer 900b, wherein the 8 signal of the first buffer 900a is electrically coupled to the n8 signal of the second buffer 900b, and wherein the 8 signal of the second buffer 900b is electrically coupled to the n8 signal of the first buffer 900a. The inputs are S 1050, D 1042, CLK 1044 and nCLK 1046, where CLK 1044 and nCLK 1046 are complementary. The output is Q 1048. The input S 1050 is at logic '1' where both two settable tristate buffers 900a and 900*b* are set; the output Q 1048 is at logic '1'. Conversely, the input S 1050 is at the logic '0' where the settable latch design 1040 is functionally the same as the latch design 1000 depicted in FIG. 10A.

Figure 11A:
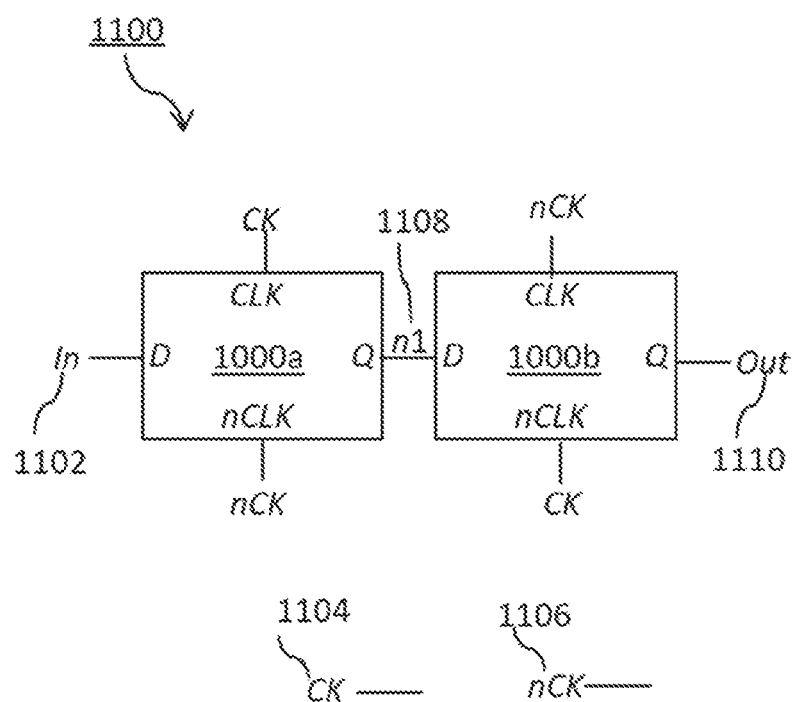
FIGS. 11A, 11B and 11C are schematic diagrams of exemplary embodiments of circuit.

FIG. 11A depicts an exemplary design of a D flip-flop 1100 comprising two latches 1000*a* and 1000*b* connected in a series manner, wherein the output Q of the first latch 1000*a* is electrically coupled to the input D of the second latch 1000*b*. The latches 1000*a* and 1000*b* are each the same latch 1000 as depicted in FIG. 10A. The two latches 1000*a* and 1000*b* form a master-slave latch structure. The inputs are D 1102, CK 1104 and nCK 1106, where CK 1104 and nCK 1106 are complementary. The output is Out 1110. When the signals CLK 1104 and nCLK 1106 is at logic '1' and logic '0' respectively, the latch 1000*a* is in the transparent state where the signal n1 1108 follows the input In 1102 and the latch 1000*b* is still latching the previous signal where the output Out 1110 is uncharged. Conversely, when the signals CLK 1104 and nCLK 1106 are at logic '0' and logic '1' respectively, the latch 100*b* is in the transparent state where the output Out 1110 follows the signal n1 1108 and the latch 1000*a* is still latching the signal n1 1108.

Figure 11B:
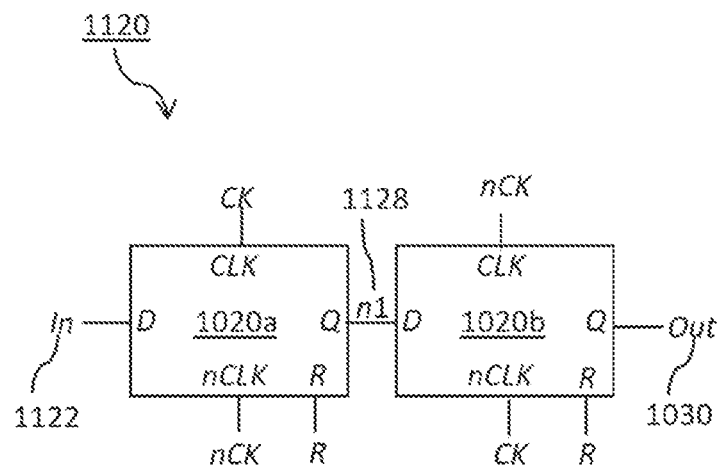

FIG. 11B depicts an exemplary design of a D flip-flop 1120 comprising two resettable latches 1020*a* and 1020*b* connected in a series manner, wherein the output Q of the first latch 1020*a* is electrically coupled to the input D of the second latch 1020*b*. The latches 1020*a* and 1020*b* are each the same latch 1020 as depicted in FIG. 10B. The two resettable latches 1020*a* and 1020*b* form a master-slave latch structure. The inputs are R 1132, D 1122, CK 1124 and nCK 1126, where CK 1124 and nCK 1126 are complementary. The output is Out 1130. The signal R 1132 is at logic '1' where both the two resettable latches 1020*a* and 1020*b* are reset, where the signal n1 1128 and the output Out 1130 are at logic '0'. Conversely, the signal R 1132 is at logic '0' where the resettable D flip-flop design 1120 is functionally the same as the D flip-flop design 1100 depicted in FIG. 11A.

Figure 11C:
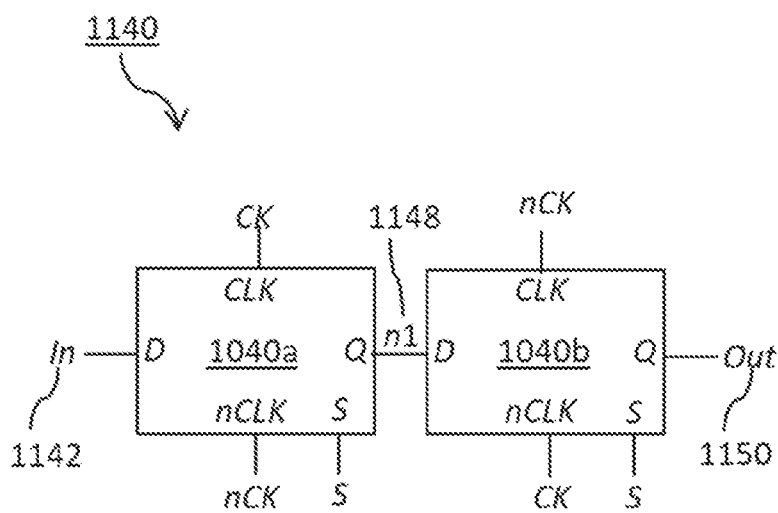

FIG. 11C depicts an exemplary design of a D flip-flop 1140 comprising two settable latches 1040*a* and 1040*b* connected in a series manner, wherein the output Q of the first latch 1040*a* is electrically coupled to the input D of the second latch 1040*b*. The latches 1040*a* and 1040*b* are each the same latch 1040 as depicted in FIG. 10C. The two settable latches 1040*a* and 1040*b* form a master-slave latch structure. The inputs are S 1152, D 1142, CK 1144 and nCK 1146, where CK 1144 and nCK 1146 is complementary. The output is Out 1150. The signal S 1152 is at logic '0' where both the two settable latches 1040*a* and 1040*b* are set, where the signal n1 1148 and the output Out 1150 are at logic '1'. The signal S 1152 is at logic '1' where the settable D flip-flop design 1140 is functionally the same as the D flip-flop design 1100 depicted in FIG. 11A.

In alternative embodiments (not shown), other latch and flip-flop designs can be realized, including designs with set, with resets, with enable signals, with other control signals. The latch and flip-flop designs may also be optimized by incorporating/sharing parts of the same circuitry or including additional circuitry.

Figure 12:
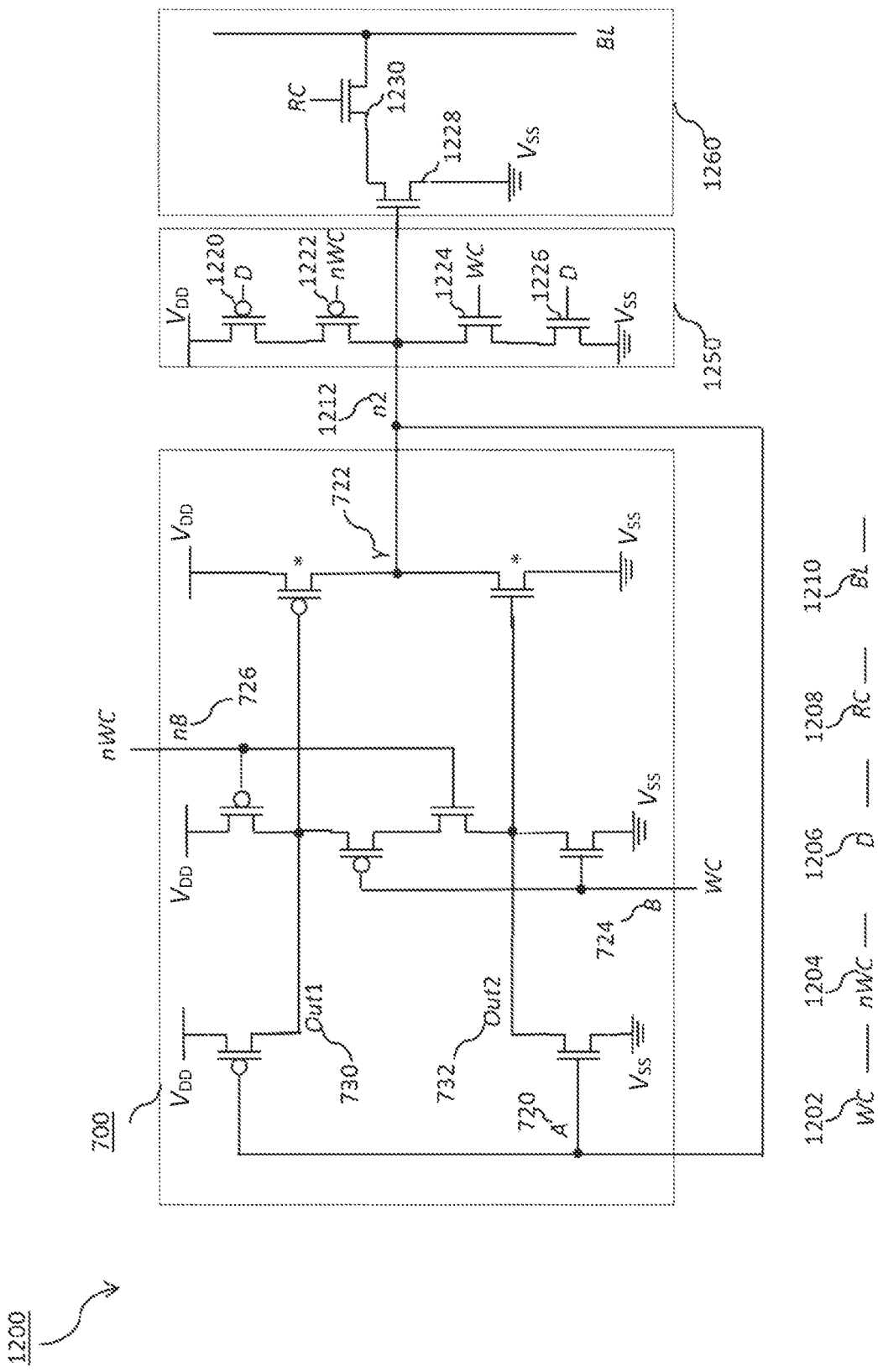
FIG. 12 is a schematic diagram of an exemplary embodiment of a circuit for mitigating SETs configured as a memory circuit.

FIG. 12 depicts an exemplary embodiment of a circuit 1200 for mitigating SETs configured as a memory circuit 1200. The memory circuit 1200 comprises the tristate buffer 700 described above with reference to FIG. 7, a write sub-circuit 1250 and a read sub-circuit 1260. The input signals are WC 1202, nWC 1204, D 1206 and RC 1208. The signals WC 1202 and nWC 1204 are complementary. The output signal is BL 1210. The output Y of the tristate buffer 700 is connected to its input A 720, collectively producing a signal n2 1212 to the memory circuit 1200. The write sub-circuit 1250 comprises two PMOS transistors 1220, 1222 connected in series with each other, and two NMOS transistors 1224, 1226 connected in series with each other. The read sub-circuit 1260 comprises two NMOS transistors 1228, 1230 connected in series with each other. The signal n2 1212 is connected to the drain terminal of the PMOS transistor 1222 and to the drain terminal of the NMOS transistor 1224 of the write sub-circuit 1250. The signal n2 1212 further controls the NMOS transistor 1228 of the read sub-circuit 1260. The write control signals WC 1202 and n WC 1204 respectively control the signals B 724 and nB 726 of the tristate buffer 700. The write control signals WC 1202 and n WC 1204 respectively control the NMOS transistor 1224 and the PMOS transistor 1222 of the write sub-circuit 1250. The write data signal D 1206 controls the PMOS transistor 1220 and NMOS transistor 1226 of the write sub-circuit 1250. The read control signal RC 1208 controls the NMOS transistor 1230 of the read sub-circuit 1260. The bitline BL 1210 is connected to the drain of the NMOS transistor 1230 of the read sub-circuit 1260.

In a scenario which is waiting for a read operation, the write control signals WC 1202 and nWC 1204 are at logic '0' and '1' respectively, and the signal n2 1212 is latched by the tristate buffer 700. The signal RC 1208 is at logic '1' so that a stored logic '1' at the signal n2 1212 controls the NMOS transistor 1228 to discharge the bitline BL 1212 to a logic '0', or otherwise a stored logic '0' at the signal n2 1212 may not control the NMOS transistor 1228, leaving the bitline BL 1212 to remain as logic '1' (assuming that the bitline BL 1212 is as logic '1'). The signal RC 1208 is at logic '0' for no read operation.

In a scenario which is for a write operation, the write control signals WC 1202 and nWC 1204 are at logic '1' and '0' respectively, and the tristate buffer 700 is in the high impedance state. However, the write sub-circuit 1250 may write a new data into the signal n2 1212. The data D 1206 is at logic '1', controlling the NMOS transistor 1226 of the write sub-circuit 1250 to discharge the signal n2 1212 to logic '0'. The data D 1206 is at logic '0', controlling the PMOS transistor 1220 of the write sub-circuit 1250 to charge the signal n2 1212 to logic '1'.

For the memory cell 1200 depicted in FIG. 12, the write and read operations are mutually exclusive.

Figure 13:
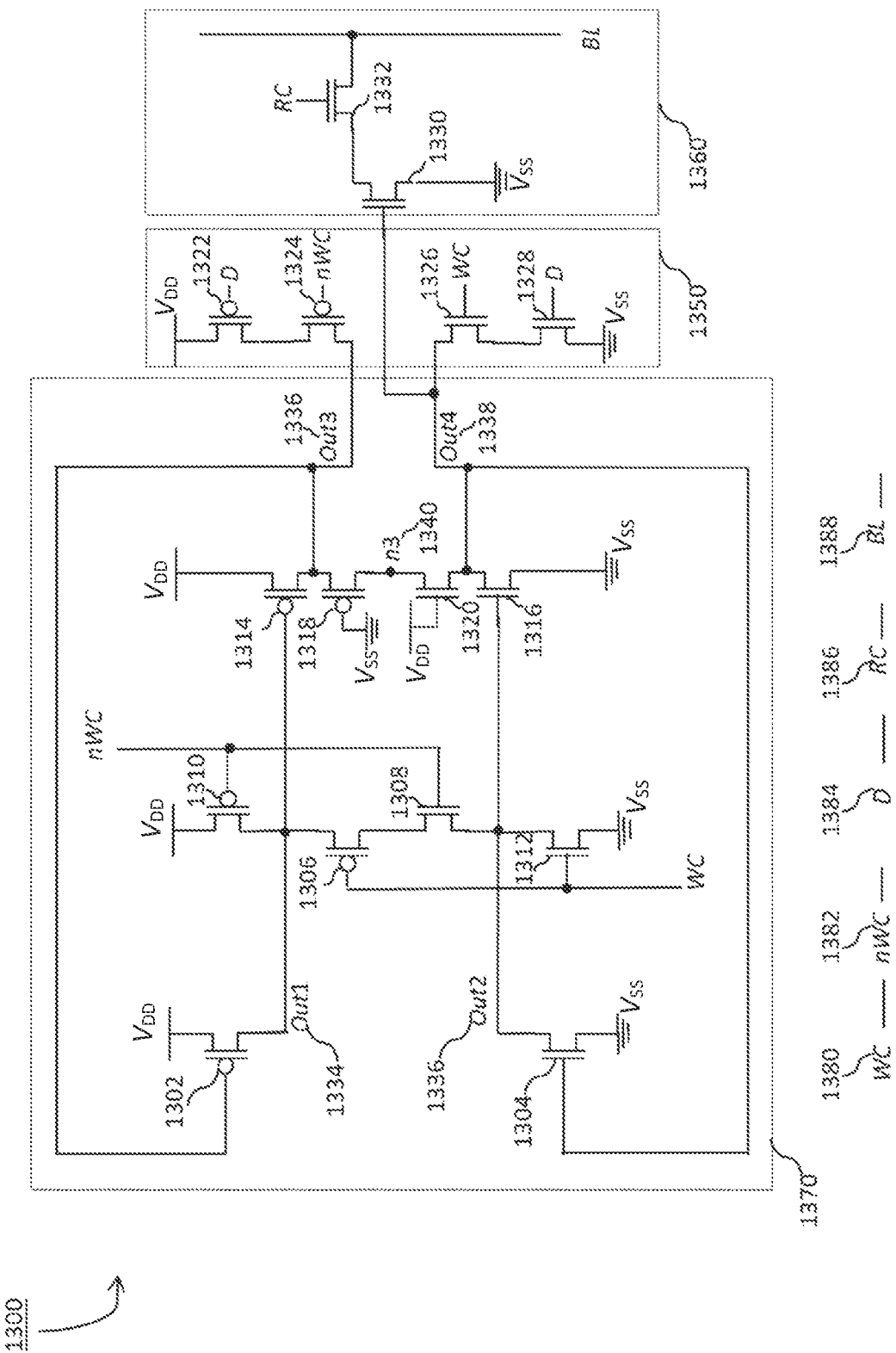
FIG. 13 is a schematic diagram of an exemplary alternative embodiment of a circuit for mitigating SETs configured as a memory circuit.

FIG. 13 depicts another exemplary embodiment of a circuit 1300 for mitigating SETs configured as a memory circuit 1300. The memory circuit 1300 comprises a storage circuit 1370, a write sub-circuit 1350 and a read sub-circuit 1360. The input signals are WC 1380, nWC 1382, D 1384 and RC 1386. The signals WC 1380 and nWC 1382 are complementary. The output signal is the signal BL 1388. The storage circuit 1370 is a variation of the embodiment of the circuit 400 shown in FIG. 4. The storage circuit 1370 comprises a first sub-circuit, a second sub-circuit and a third sub-circuit like in the circuit 400. The first sub-circuit comprises a first PMOS transistor arrangement comprising a single PMOS transistor 1302 and a first NMOS transistor arrangement comprising a single NMOS transistor 1304. The second sub-circuit is similar to the second sub-circuits 760, 860, 960 in the circuits 700, 800, 900 shown in FIGS. 7-9 respectively. The third sub-circuit comprises a last PMOS transistor arrangement and a last NMOS transistor arrangement. The last PMOS transistor arrangement comprises two PMOS transistors 1314, 1318 connected in series and the last NMOS transistor arrangement comprises two NMOS transistors 1316, 1320 connected in series. The PMOS transistor 1318 and the NMOS transistor 1320 are also connected in series, having their gates terminals connected to $V_{SS}$ and $V_{DD}$ respectively. The write sub-circuit 1350 comprises two PMOS transistors 1322 and 1324 connected in series, and two NMOS transistors 1326, 1328 connected in series. The read sub-circuit 1360 comprises two NMOS transistors 1330, 1320 connected in series.

The PMOS transistor 1302 drives the signal Out1 1334 which controls the PMOS transistor 1314. The NMOS transistor 1304 drives the signal Out2 1336 which controls the NMOS transistor 1316. The signals Out1 1334 and Out2 1336 are electrically connected via the PMOS transistor 1306 and the NMOS transistor 1308, where the PMOS transistor 1306 and the NMOS transistor 1308 function as a resistive network, or are otherwise respectively charged to the supply voltage $V_{DD}$ by the PMOS transistor 1310 and discharged to ground $V_{SS}$ by the NMOS transistor 1312. The PMOS transistor 1314 drives the signal Out3 1336 which controls the PMOS transistor 1302. The NMOS transistor 1316 drives the signal Out4 1338 which controls the NMOS transistor 1304. The signals Out3 1336 and Out4 1338 are electrically connected by the PMOS transistor 1318 and the NMOS transistor 1320, where the PMOS transistor 1318 and the NMOS transistor 1320 function as a resistive network. The signal Out3 1336 is driven by the PMOS transistors 1222, 1224 of the write sub-circuit 1250. The signal Out4 1338 is driven by the NMOS transistors 1226, 1228 of the write sub-circuit 1250. The signal Out4 1338 controls the NMOS transistor 1330 of the read sub-circuit 1260.

In a scenario which is waiting for a read operation, the write control signals WC 1380 and nWC 1382 are at the logic '0' and '1' respectively, and the signals Out3 1336 and Out4 1338 are latched by the storage circuit 1370. How the signals Out3 1336 and Out4 1338 are latched will now be explained, as follows.

Consider first the signal Out3 1336 at the strong logic '1' (i.e. $V_{DD}$), the signal Out4 1338 is at the weak logic '1' (i.e. $V_{DD}-V_{tn}$) which controls the NMOS transistor 1304 to discharge the signal Out2 1336 to $V_{SS}$. As the PMOS transistor 1306 and the NMOS transistor 1308 are on, the signal Out1 1334 is electrically connected to the signal Out2 1336, and is at the weak logic '0' (i.e. $V_{tp}$). The signal Out1 1334 controls the PMOS transistor 1314 to maintain the signal Out3 1336 at the strong logic '1'.

Consider now the signal Out4 1338 at the strong logic '0' (i.e. $V_{SS}$), the signal Out3 1336 is at the weak logic '0' (i.e. $V_{tp}$) which controls the PMOS transistor 1302 to charge the signal Out1 1334 to $V_{DD}$. As the PMOS transistor 1306 and the NMOS transistor 1308 are on, the signal Out2 1336 is electrically connected to the signal Out1 1334, and is at the weak logic '1' (i.e. $V_{DD}-V_{tn}$). The signal Out2 1336 may to control the NMOS transistor 1316 to maintain the signal Out4 1336 at the strong logic '0'.

In the abovementioned scenario where the write control signals WC 1380 and nWC 1382 are at the logic '0' and '1', the signal RC 1388 is at logic '1' so that a stored weak logic '1' at the signal Out4 1338 controls the NMOS transistor 1330 to discharge the bitline BL 1388 to a logic '0', or otherwise a stored strong logic '0' at the signal Out4 1338 may not control the NMOS transistor 1330, leaving the bitline BL 1338 to remain as a logic '1' (assuming that the bitline BL 1338 is initialized as logic '1'). The signal RC 1386 is at logic '0' for no read operation.

In a scenario which is for a write operation, the write control signals WC 1202 and nWC 1204 are at logic '1' and '0' respectively, and the storage circuit 1370 may not drive the signals Out3 1336 and Out4 1338. However, the write sub-circuit 1350 may write a new data into the signal Out3 1336 or the signal Out4 1338. When the data D 1384 is at the logic '1', this controls the NMOS transistor 1328 of the write sub-circuit 1350 to discharge the signal Out4 1338 to logic '0'. Conversely, when the data D 1384 is at the logic '0', this controls the PMOS transistor 1322 of the write sub-circuit 1350 to charge the signal Out3 1336 to logic '1'.

For the memory cell 1300 depicted in FIG. 13, the write and read operations are mutually exclusive.

In alternative embodiments (not shown), the second PMOS transistor 1318 may comprise an arrangement of a plurality of PMOS transistors and the NMOS transistor 1320 may comprise an arrangement of a plurality of NMOS transistors.

Notably, the transistors 1318 and 1320 are always on, capable of mitigating SETs. In this case, the transistors 1314, 1316, 1318 and 1320 may not need to be upsized.

It should be appreciated that the techniques disclosed herein may easily be applied to any combinational circuits (e.g. NAND, AND, NOR, OR, XOR, XNOR, AOI, OAI, etc.) and any sequential logic circuits (e.g. latches, flip-flops, state-holding circuits or memory cells) or other circuits. Any modifications, including the change of transistor configuration or the change of the input signals, is made without deviating from the conceptual consideration or idea where a resistive network is used to electrically connect the pull-up network and pull-down network of a circuit. The resistive network, having a PMOS transistor connected to the pull-up network of the circuit and having an NMOS transistor connected to the pull-down network of the circuit, may mitigate SETs at the output of the circuit.

As described above, in the context of various embodiments, a circuit is provided, where at least some or only some of the transistors of the circuit is up-sized for mitigating SEEs. The circuit is a combinational circuit, a tristate buffer, a memory cell circuit or other circuits. There may also be provided one or more circuit arrangements (for example, digital logic circuits, e.g., sequential logic circuit), where each circuit arrangement may have a plurality of circuits electrically coupled to each other, where at least one of the circuits is the circuit (e.g., tristate buffer with up-sized transistors) described above. In some embodiments, each circuit of the plurality of circuits is the circuit (e.g., tristate buffer with up-sized transistors) described above.

Various embodiments employed in various applications, including but not limited to circuits/systems for high-rel applications. For example, one possible application pertains to space and satellite applications. In space, radiation effects are severe, and various embodiments may help satellite applications (e.g., pico-satellites, nano-satellites, macro-satellites in Low-Earth-Orbit (LEO), and big satellites in GEO) to mitigate SEEs, hence, making these satellites more versatile and extending their life-span. Another possible application pertains to automotive industry, for example, autonomous cars. For autonomous cars, the error rates of digital circuits must be very low for safety concern, where the techniques disclosed herein may help to address this concern. A third possible application pertains to high-rel medical applications. For example, implantable electronic devices require high reliability for safety concern, where the techniques disclosed herein may help to address this concern. Nevertheless, it should be appreciated that the techniques disclosed herein and the various embodiments may also be employed in various other applications, including applications where reliability is an issue.

While the invention has been particularly shown and described with reference to specific embodiments, it should be understood by those skilled in the art that various changes in form and detail is made therein without departing from the spirit and scope of the invention as defined by the appended claims. For example, the terms PMOS and NMOS as used in the description above may be interchangeably used with the terms p-type and n-type respectively as other p-type transistors and n-type transistors may be used besides the described PMOS transistors and NMOS transistors respectively. The scope of the invention is thus indicated by the appended claims and all changes which come within the meaning and range of equivalency of the claims are therefore intended to be embraced.

REFERENCES

[1] P. E. Dodd, M. R. Shaneyfelt, J. R. Schwank and J. A. Felix, "Current and Future Challenges in Radiation Effects on CMOS Electronics," *IEEE Transactions on Nuclear Science*, vol. 57, no. 4, pp. 1747-1763, August 2010.

[2] R. C. Lacoe, "Improving Integrated Circuit Performance Through the Application of Hardness-by-Design Methodology," *IEEE Transactions on Nuclear Science*, vol. 55, no. 4, pp. 1903-1925, August 2008.

[3] R. C. Lacoe, J. V. Osborn, R. Koga, S. Brown and D. C. Mayer, "Application of hardness-by-design methodology to radiation-tolerant ASIC technologies," *IEEE Transactions on Nuclear Science*, vol. 47, no. 6, pp. 2334-2341, December 2000.

[4] R. M. Diestelhorst et al., "Junction Isolation Single Event Radiation Hardening of a 200 GHZ SiGe:C HBT Technology Without Deep Trench Isolation," *IEEE Transactions. Nuclear Science*, vol. 56, no.6, pp. 3402-3407, December 2009.

[5] Calin, T. et al., "Upset Hardened Memory Design for Submicron CMOS Technology," *IEEE Transactions on Nuclear Science*, vol. 43, No. 6, pp. 2874-2878, December 1996.

[6] J. E. Kundsen and L. T. Clark "Radiation hardened master-slave flip-flop," U.S. Pat. No. 7,719,304, May 19, 2010.

[7] H. H. K. Lee, K. Lilja, M. Bounasser, I. Linscott and U. Inan, "Design Framework for Soft-Error-Resilient Sequential Cells," *IEEE Transactions on Nuclear Science*, vol. 58, no. 6, pp. 3026-3032, December 2011.

[8] B. Narasimham et al., "A Hysteresis-Based D-Flip-Flop Design in 28 nm CMOS for Improved SER Hardness at Low Performance Overhead," *IEEE Transactions on Nuclear Science*, vol. 59, no. 6, pp. 2847-2851, December 2012.

[9] T. Lin, K. S. Chong, W. Shu, N. K. Z. Lwin, J. Jiang and J. S. Chang, "Experimental investigation into radiation-hardening-by-design (RHBD) flip-flop designs in a 65 nm CMOS process," in Proc. *IEEE International Symposium on Circuits and Systems* (ISCAS), 2016, pp. 966-969.

[10] R. Naseer and J. Draper, "DF-DICE: a scalable solution for soft error tolerant circuit design," in Proc. *IEEE International Symposium on Circuits and Systems* (ISCAS), 2006.

[11] S. Campitelli, M. Ottavi, S. Pontarelli, A. Marchioro, D. Felici and F. Lombardi, "F-DICE: A multiple node upset tolerant flip-flop for highly radioactive environments," in Proc. *IEEE International Symposium on Defect and Fault Tolerance in VLSI and Nanotechnology Systems* (DFTS), 2013, pp. 107-111.

[12] M. Cabanas-Holmen et al., "Robust SEU Mitigation of 32 nm Dual Redundant Flip-Flops Through Interleaving and Sensitive Node-Pair Spacing," *IEEE Transactions on Nuclear Science*, vol. 60, no. 6, pp. 4374-4380, December 2013.

[13] M Cabanas-Holmen, E Cannon, and SA Rabaa, "Filtered radiation hardened flip flop with reduced power consumption," U.S. Pat. No. 9,013,219, Apr. 21 2015.

[14] Intersil, "Radiation Hardened Octal Transparent Latch, Three-State," HCS573MS datasheet, September 1995.

[15] W. Jang. *Soft-error Tolerant Quasi Delay-Insensitive Circuits*. PhD Thesis, 2008.

[16] R. Yamamoto et al., "An Area-Efficient 65 nm Radiation-Hard Dual-Modular Flip-flop to avoid multiple cell upsets," *IEEE Transactions. Nuclear Science*, vol. 58, no.6, pp. 3053-3059, December 2011.

[17] J. Chen et al., "Radiation Hardened by Design Techniques to Reduce Single Event Transient Pulse Width Based on the Physical Mechanism," *Microelectronics Reliability*, vol. 52, no. 6, pp. 1227-1232, 2012.

[18] T. Lin, K. S. Chong, W. Shu, N. K. Z. Lwin, J. Jiang and J. S. Chang, "Experimental investigation into radiation-hardening-by-design (RHBD) flip-flop designs in a 65 nm CMOS process," 2016 *IEEE International Symposium on Circuits and Systems* (ISCAS), Montreal, QC, 2016, pp. 966-969.

[19] J. S. Chang et al., "Radiation-hardened library cell template and its total ionizing dose (TID) delay characterization in 65 nm CMOS process," 2014 *IEEE 57th International Midwest Symposium on Circuits and Systems* (MWSCAS), College Station, TX, 2014, pp. 821-824.

[20] J. Jiang et al., "Total Ionizing Dose (TID) effects on finger transistors in a 65 nm CMOS process," 2016 *IEEE International Symposium on Circuits and Systems* (ISCAS), Montreal, QC, 2016, pp. 5-8.

[21] J. Jiang, W. Shu and J. S. Chang, "A 5.6 ppm/° C. Temperature Coefficient, 87-dB PSRR, Sub-1-V Voltage Reference in 65-nm CMOS Exploiting the Zero-Temperature-Coefficient Point," in *IEEE Journal of Solid-State Circuits*, vol. 52, no. 3, pp. 623-633, March 2017.

[22] J. S. Chang, K.-S. Chong, T. Lin, K. Z. L. Ne, and H. Sivaramakrishnam, "Device-cum-Layout Technique to Mitigate Single Event Effects," Singapore Provisional Patent Application (PAT/044/17/17/SG PRV).

[23] J. S. Chang, K.-S. Chong, K. Z. L. Ne, and H. Sivaramakrishnam, "Low Soft-Error-Rate Digital Circuit," Singapore Provision Patent Application," Singapore Provisional Patent Application (PAT/294/17/18/SG PRV)

[24] J. S. Chang, K.-S. Chong, K. Z. L. Ne, and H. Sivaramakrishnam, "Ultra Low Soft-Error-Rate Digital Gate," Singapore Provisional Patent Application (PAT/339/17/18/SG PRV).

[25] K. Wang, L. Chen, and J. Yang, "An ultra low power fault tolerant SRAM in 90 nm CMOS," 2009.

[26] T-.Hua Chen, J. Chen, L. T. Clark, J. E. Knudsen and G. Samson, "Ultra-Low Power Radiation Hardened by Design Memory Circuits," *IEEE Trans. Nuclear Science*, vol. 54, no. 6, December 2007.

[27] L. R. Rockett, "Soft error resistant data storage cells," European patent, 0335 008 B1.

[28] D. C. Lawson, and J. F. Ross, "Single Event Upset hardened Static Random Access Memory Cell," U.S. Pat. No. 8,189,367 B1.

[29] H. Liu, "Radiation-Hardened SRAM Cell with Write Error Protection," U.S. Pat. No. 7,233,518 B2.

[30] K. W. Golke, H. Liu, D. K. Nelson, "Radiation-Hardened Memory Element with Multiple Delay Elements," U.S. Patent Application, 2007/0242537 A1.

[31] H. Sang et al, "Radiation-Hardened Storage Unit," U.S. Pat. No. 8,988,922 B1.

The invention claimed is:

1. A circuit for mitigating single-effect-transients (SETs) having a first input, a second input, a first complementary input, a second complementary input, a first output and a second output, and comprising:
   a first sub-circuit comprising:
      a first p-type transistor arrangement comprising at least one p-type transistor configured to generate the first output, and
      a first n-type transistor arrangement comprising at least one n-type transistor configured to generate the second output; and
   a second sub-circuit comprising:
      a connecting p-type transistor arrangement comprising at least one p-type transistor,
      a connecting n-type transistor arrangement comprising at least one n-type transistor connected in series to the connecting p-type transistor arrangement, wherein a drain terminal of the at least one p-type transistor in the connecting p-type transistor arrangement and a drain terminal of the at least one n-type transistor in the connecting n-type transistor arrangement are electrically coupled to each other, and
      a second p-type transistor arrangement comprising at least one p-type transistor and a second n-type transistor arrangement comprising at least one n-type transistor, wherein
         the first output is further electrically coupled to a drain terminal of the at least one p-type transistor in the second p-type transistor arrangement,
         the second output is further electrically coupled to a drain terminal of the at least one n-type transistor in the second n-type transistor arrangement,
         a gate terminal of the at least one p-type transistor in the connecting p-type transistor arrangement and a gate terminal of the at least one n-type transistor in the second n-type transistor arrangement are controlled by the first complementary input,
         a gate terminal of the at least one n-type transistor in the connecting n-type transistor arrangement and a gate terminal of the at least one p-type transistor in the second p-type transistor arrangement are controlled by the second complementary input,
         a source terminal of the at least one p-type transistor in the second p-type transistor arrangement is electrically coupled to $V_{DD}$, and
         a source terminal of the at least one n-type transistor in the second n-type transistor arrangement is electrically coupled to $V_{SS}$,
   wherein the first output and the second output are electrically coupled to each other through the second sub-circuit through the connecting p-type transistor arrangement of the second sub-circuit and the connecting n-type transistor arrangement of the second sub-circuit.

2. The circuit of claim 1, wherein the first output is electrically coupled to a drain terminal of the at least one p-type transistor in the first p-type transistor arrangement and to a source terminal of the at least one p-type transistor in the connecting p-type transistor arrangement, and the second output is electrically coupled to a drain terminal of the at least one n-type transistor in the first n-type transistor arrangement and to a source terminal of the at least one n-type transistor in the connecting n-type transistor arrangement.

3. The circuit of claim 1, wherein a source terminal of the at least one p-type transistor in the first p-type transistor arrangement is electrically coupled to $V_{DD}$, and wherein a source terminal of the at least one n-type transistor in the first n-type transistor arrangement is electrically coupled to $V_{SS}$.

4. The circuit of claim 1, further having a third output and a fourth output, and comprising:
   a third sub-circuit comprising:
      a third p-type transistor arrangement comprising at least one p-type transistor configured to generate the third output, and
      a third n-type transistor arrangement comprising at least one n-type transistor configured to generate the fourth output,
      wherein
         the first output is connected to a gate terminal of the at least one p-type transistor in the third p-type transistor arrangement,
         the second output is connected to a gate terminal of the at least one n-type transistor in the last n-type transistor arrangement,
         a source terminal of the at least one p-type transistor in the third p-type transistor arrangement is electrically coupled to $V_{DD}$, and
         a source terminal of the at least one n-type transistor in the third n-type transistor arrangement is electrically coupled to $V_{SS}$.

5. The circuit of claim 4, further having a reset input wherein
   the third p-type transistor arrangement comprises two p-type transistors connected in series,
   the third n-type transistor arrangement comprises two n-type transistors connected in parallel, and
   the reset input is electrically coupled to a gate of one of the two p-type transistors in the third p-type transistor arrangement and a gate of one of the two n-type transistors in the third n-type transistor arrangement.

6. The circuit of claim 4, further having a set input wherein
   the third p-type transistor arrangement comprises two p-type transistors connected in parallel,
   the third n-type transistor arrangement comprises two n-type transistors connected in series, and
   the set input is electrically coupled to a gate of one of the two p-type transistors in the third p-type transistor arrangement and a gate of one of the two n-type transistors in the third n-type transistor arrangement.

7. The circuit of claim 4, wherein the third output and the fourth output are electrically coupled to generate a one output.

8. The circuit of claim 7, wherein the first p-type transistor arrangement receives the first input to control the first output, the first n-type transistor arrangement receives the second input to control the second output, the first input and the second input are a same one input, further comprising:
   a write data input,
   a read control input,
   a bitline output,
   a write sub-circuit comprising:
      two p-type transistors connected in series between $V_{DD}$ and the third output, and
      two n-type transistors connected in series between $V_{SS}$ and the fourth output, and a read sub-circuit comprising two n-type transistors connected in series between $V_{SS}$ and the bitline output;
wherein
the first complementary input controls one of the two n-type transistors of the write sub-circuit,
the second complementary input controls one of the two p-type transistors of the write sub-circuit,
the write data input controls the other of the two p-type transistors of the write sub-circuit and the other of the two n-type transistors of the write sub-circuit,
the one output is electrically coupled to the two p-type transistors of the write sub-circuit and to the two n-type transistors of the write sub-circuit, wherein the one output controls one of the two n-type transistors of the read sub-circuit, and
the read control signal controls the other of the two n-type transistors of the read sub-circuit.

9. A circuit arrangement comprising a plurality of the circuit of claim 7 electrically coupled to each other.

10. The circuit arrangement of claim 9, wherein the plurality of the circuit comprises a first circuit and a second circuit, and wherein
the one output of the first circuit is electrically coupled to
the first input of the second circuit,
the second input of the second circuit, and
the one output of the second circuit,
the first complementary input of the first circuit is electrically coupled to the second complementary input of the second circuit, and
the second complementary input of the first circuit is electrically coupled to the first complementary input of the second circuit.

11. The circuit of claim 4, further comprising:
a write data input,
a read control input,
a bitline output,
a write sub-circuit comprising:
two p-type transistors connected in series between $V_{DD}$ and the third output, and
two n-type transistors connected in series between $V_{SS}$ and the fourth output, and
a read sub-circuit comprising two n-type transistors connected in series between $V_{SS}$ and the bitline output,
wherein
the third p-type transistor arrangement comprises a number of p-type transistors connected in series,
the third n-type transistor arrangement comprises a number of n-type transistors connected in series,
a p-type transistor in the third p-type transistor arrangement and a n-type transistor in the third n-type transistor arrangement are connected in series and their gate terminals are connected to $V_{SS}$ and $V_{DD}$ respectively,
the first complementary input controls one of the two n-type transistors of the write sub-circuit,
the second complementary input controls one of the two p-type transistors of the write sub-circuit,
the write data input controls the other of the two p-type transistors of the write sub-circuit and the other of the two n-type transistors of the write sub-circuit,
the third output is electrically coupled to the first input, to the two p-type transistors of the write sub-circuit, and to the third p-type transistor arrangement,
the fourth output is electrically coupled to the second input, to the two n-type transistors of the write sub-circuit, and to the third n-type transistor arrangement, and controls one of the two n-type transistors of the read sub-circuit, and
the read control input controls the other of the two n-type transistors of the read control circuit.

12. The circuit of claim 4, wherein the first output drives only p-type transistors and the second output drives only n-type transistors.

13. The circuit of claim 1, wherein the first p-type transistor arrangement receives the first input to control the first output, and the first n-type transistor arrangement receives the second input to control the second output.

14. The circuit of claim 13, wherein the first input and the second input are a same one input.

15. The circuit of claim 13, wherein the first complementary input controls the connecting p-type transistor arrangement, and wherein the second complementary input controls the connecting n-type transistor arrangement.

16. The circuit of claim 1, wherein the first p-type transistor arrangement comprises at least first and second p-type transistors, wherein the first and second p-type transistors are connected in one of: series or parallel.

17. The circuit of claim 16, wherein the first p-type transistor arrangement further comprises a third p-type transistor, wherein the third p-type transistor is connected in series with the first and second p-type transistors when the first and second p-type transistors are connected in parallel, and wherein the third p-type transistor is connected in parallel with the first and second p-type transistors when the first and second p-type transistors are connected in series.

18. The circuit of claim 1, wherein the first n-type transistor arrangement comprises at least first and second transistors, wherein the first and second n-type transistors are connected in one of: series or parallel.

19. The circuit of claim 18, wherein the first n-type transistor arrangement further comprises a third n-type transistor, wherein the third n-type transistor is connected in series with the first and second n-type transistors when the first and second n-type transistors are connected in parallel, and wherein the third n-type transistor is connected in parallel with the first and second n-type transistors when the first and second n-type transistors are connected in series.

* * * * *